(12) United States Patent
Nakata et al.

(10) Patent No.: US 10,998,380 B2
(45) Date of Patent: May 4, 2021

(54) IMAGING DEVICE INCLUDING AT LEAST ONE UNIT PIXEL CELL AND VOLTAGE APPLICATION CIRCUIT

(71) Applicant: Panasonic Intellectual Property Management Co., Ltd., Osaka (JP)

(72) Inventors: Manabu Nakata, Osaka (JP); Masumi Izuchi, Osaka (JP); Shinichi Machida, Osaka (JP); Yasunori Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 62 days.

(21) Appl. No.: 16/188,327

(22) Filed: Nov. 13, 2018

(65) Prior Publication Data

US 2019/0081106 A1    Mar. 14, 2019

Related U.S. Application Data

(63) Continuation of application No. PCT/JP2017/023882, filed on Jun. 29, 2017.

(30) Foreign Application Priority Data

Aug. 5, 2016    (JP) .............................. JP2016-154506

(51) Int. Cl.
*H04N 5/33*    (2006.01)
*H01L 27/30*    (2006.01)
(Continued)

(52) U.S. Cl.
CPC .......... *H01L 27/307* (2013.01); *H01L 27/286* (2013.01); *H01L 51/0068* (2013.01);
(Continued)

(58) Field of Classification Search
CPC . H01L 27/286; H01L 27/307; H01L 51/0046; H01L 51/0061; H01L 51/0068;
(Continued)

(56) References Cited

U.S. PATENT DOCUMENTS 5,235,542 A * 8/1993 Hayashi ............ H01L 27/14643
250/208.1
8,022,395 B2 * 9/2011 Hioki ................. H01L 27/14647
257/40

(Continued)

FOREIGN PATENT DOCUMENTS

JP    2005-303266    10/2005
JP    2007-104113    4/2007
(Continued)

OTHER PUBLICATIONS

International Search Report of PCT application No. PCT/JP2017/023882 dated Aug. 8, 2017.

*Primary Examiner* — Gims S Philippe
(74) *Attorney, Agent, or Firm* — McDermott Will and Emery LLP

(57) ABSTRACT

An imaging device includes at least one unit pixel cell including a photoelectric converter and a voltage application circuit. The photoelectric converter includes a first electrode, a light-transmitting second electrode, a first photoelectric conversion layer containing a first material and a second photoelectric conversion layer containing a second material. The impedance of the first photoelectric conversion layer is larger than the impedance of the second photoelectric conversion layer. The voltage application circuit applies a first voltage or a second voltage having a larger absolute value than the first voltage selectively between the first electrode and the second electrode.

16 Claims, 14 Drawing Sheets

(51) Int. Cl.
  H04N 5/374 (2011.01)
  H04N 9/04 (2006.01)
  H04N 5/369 (2011.01)
  H04N 9/07 (2006.01)
  H01L 27/28 (2006.01)
  H01L 51/00 (2006.01)
  H01L 51/42 (2006.01)

(52) U.S. Cl.
  CPC ...... *H01L 51/0084* (2013.01); *H01L 51/4246* (2013.01); *H04N 5/33* (2013.01); *H04N 5/369* (2013.01); *H04N 5/374* (2013.01); *H04N 9/04553* (2018.08); *H04N 9/07* (2013.01); *H01L 51/0046* (2013.01); *H01L 51/0061* (2013.01); *H01L 51/0071* (2013.01); *H01L 51/0078* (2013.01)

(58) Field of Classification Search
  CPC ............. H01L 51/0071; H01L 51/0078; H01L 51/0084; H01L 51/4246; H04N 5/33; H04N 5/374; H04N 9/04553; H04N 9/07
  USPC ........................................................ 348/164
  See application file for complete search history.

(56) References Cited

U.S. PATENT DOCUMENTS

| | | | |
|---|---|---|---|
| 8,035,067 B2 * | 10/2011 | Toda | H01L 27/14603 250/208.1 |
| 8,531,082 B2 * | 9/2013 | Lee | H01L 41/094 310/310 |
| 2005/0205903 A1 | 9/2005 | Hioki | |
| 2007/0076093 A1 | 4/2007 | Misawa | |
| 2011/0180688 A1 * | 7/2011 | Nakahara | H01L 21/02425 250/208.1 |
| 2012/0043989 A1 * | 2/2012 | Shingai | H02S 50/10 324/761.01 |
| 2012/0204960 A1 | 8/2012 | Kato et al. | |
| 2013/0093929 A1 * | 4/2013 | Kouyama | H04N 9/735 348/273 |
| 2014/0001455 A1 | 1/2014 | Holmes et al. | |
| 2014/0194748 A1 * | 7/2014 | Yamamoto | A61B 5/0059 600/473 |
| 2015/0207087 A1 | 7/2015 | Udaka et al. | |
| 2017/0257587 A1 * | 9/2017 | Hatano | G02B 7/34 |

FOREIGN PATENT DOCUMENTS

| | | |
|---|---|---|
| JP | 2007-335760 | 12/2007 |
| JP | 2008-091535 | 4/2008 |
| JP | 2008-227091 | 9/2008 |
| JP | 2008-227092 | 9/2008 |
| JP | 2008-283119 | 11/2008 |
| JP | 2011-119694 | 6/2011 |
| JP | 2016-086407 | 5/2016 |
| WO | 2014/024581 | 2/2014 |

* cited by examiner

SnNc

DTDCTB $C_{70}$

CZBDF

US 10,998,380 B2

IMAGING DEVICE INCLUDING AT LEAST ONE UNIT PIXEL CELL AND VOLTAGE APPLICATION CIRCUIT

BACKGROUND

1. Technical Field

The present disclosure relates to an imaging device.

2. Description of the Related Art

There is a need for an imaging device having high sensitivity not only in the visible range but also in the longer wavelength near infrared and infrared ranges for applications to security cameras and vehicle-mounted cameras for supporting safe driving. In MOS (metal oxide semiconductor) imaging devices that have been widely used, signals stored in PN photodiodes forming pixels are read through amplifier circuits including MOS field-effect transistors (MOSFETs). Silicon is a semiconductor material widely used for MOS imaging devices but cannot absorb much light with a wavelength of about 1,100 nm or longer because of its physical property limitations. It is therefore difficult for an image sensor using a silicon substrate to have sensitivity to long wavelength light. It is also known that, in the image sensor using the silicon substrate, the sensitivity of the sensor to light in the near infrared range with a wavelength of 800 nm or longer is lower than the sensitivity to light in the visible range because of the wavelength dependence of the optical absorption coefficient of silicon.

For example, Japanese Unexamined Patent Application Publication No. 2008-227091 and U.S. Patent Application Publication No. 2014/0001455 propose a technique in which a photoelectric convertor that uses an organic material as a photoelectric conversion material and detects infrared light and a photoelectric convertor that detects visible light are stacked in a vertical direction. Generally, an imaging device using an organic material has a specific absorption spectrum originating from the skeleton of the organic material, i.e., a photoelectric conversion material. Therefore, although silicon has broad spectral sensitivity over a wide wavelength range, it is difficult for this imaging device to have spectral sensitivity over a wide wavelength range. In view of this, Japanese Patent No. 4511441 proposes a technique in which, in RGB color imaging, voltages are applied to pixels individually in order to obtain uniform spectral sensitivity in the target wavelength range.

SUMMARY

In one general aspect, the techniques disclosed here feature an imaging device including: at least one unit pixel cell including a photoelectric converter that converts incident light into electric charges; and a voltage application circuit. The photoelectric converter includes a first electrode, a second electrode configured to transmit the incident light, a first photoelectric conversion layer disposed between the first electrode and the second electrode and containing a first material having an absorption peak at a first wavelength, and a second photoelectric conversion layer disposed between the first electrode and the second electrode and containing a second material having an absorption peak at a second wavelength different from the first wavelength. The impedance of the first photoelectric conversion layer is larger than the impedance of the second photoelectric conversion layer. One of the first and second wavelengths falls within a visible wavelength range, and the other of the first and second wavelengths falls within an infrared wavelength range. The voltage application circuit selectively applies a first voltage or a second voltage between the first electrode and the second electrode, and the absolute value of the second voltage is larger than the absolute value of the first voltage.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
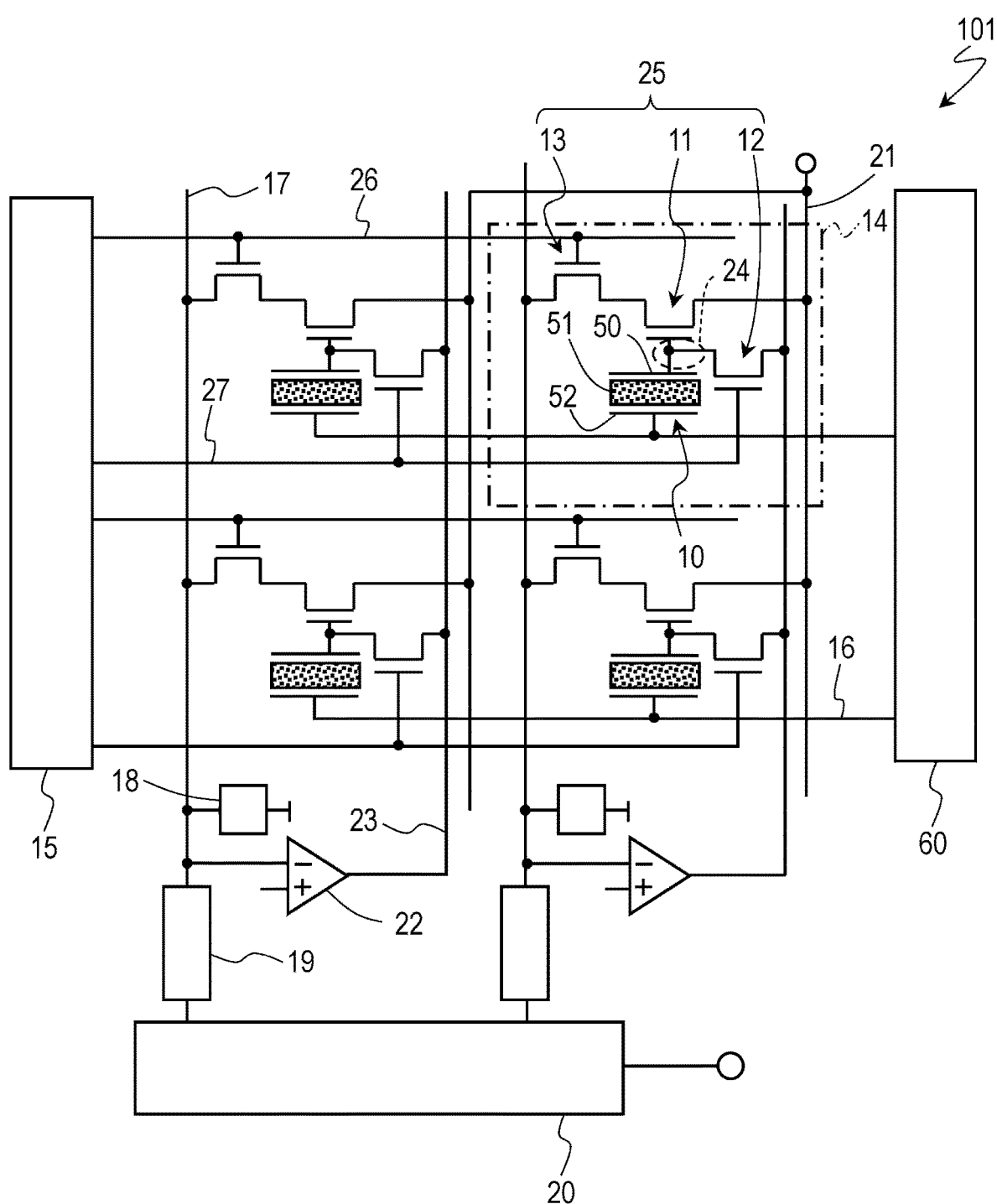
FIG. 1 is a schematic diagram showing an exemplary circuit structure of an imaging device according to an embodiment of the present disclosure.

In security cameras and vehicle-mounted cameras, images suitable for the purpose of monitoring or driving support may be obtained when the images are captured using visible light during the daytime and using infrared light during the nighttime. There is therefore a need for an imaging device with a switchable image acquirable wavelength band or switchable spectral sensitivity characteristics.

One non-limiting and exemplary embodiment provides an imaging device with a switchable image acquirable wavelength band or switchable spectral sensitivity characteristics.

Aspects of the present disclosure will be summarized below.

[Item 1] An imaging device according to Item 1 of the present disclosure includes:

at least one unit pixel cell including a photoelectric converter that converts incident light into electric charges; and a voltage application circuit.

The photoelectric converter includes a first electrode, a second electrode configured to transmit the incident light, a first photoelectric conversion layer disposed between the first electrode and the second electrode and containing a first material having an absorption peak at a first wavelength, and a second photoelectric conversion layer disposed between the first electrode and the second electrode and containing a second material having an absorption peak at a second wavelength different from the first wavelength.

An impedance of the first photoelectric conversion layer is larger than an impedance of the second photoelectric conversion layer.

One of the first and second wavelengths falls within a visible wavelength range, and the other of the first and second wavelengths falls within an infrared wavelength range.

The voltage application circuit selectively applies a first voltage or a second voltage between the first electrode and the second electrode, and an absolute value of the second voltage is larger than an absolute value of the first voltage.

In this structure, by changing the voltage applied between the first and second electrodes, the spectral sensitivity characteristics of the photoelectric converter can be changed electrically. In this structure, one voltage selected from the plurality of voltages can be selectively applied to the photoelectric converter. The visible wavelength range is a wavelength range of, for example, 380 nm or more and less than 750 nm, and the infrared wavelength range is a wavelength range of 750 nm or more.

[Item 2] In the imaging device according to Item 1, the first wavelength may fall within the visible wavelength range, and the second wavelength may fall within the infrared wavelength range.

In this structure, the sensitivity of the imaging device in the infrared wavelength range can be electrically changed.

[Item 3] In the imaging device according to Item 1 or 2, the impedance of the first photoelectric conversion layer per unit thickness may be larger than the impedance of the second photoelectric conversion layer per unit thickness.

In this structure, when a voltage is applied between the first and second electrodes, the voltage applied to the first photoelectric conversion layer may be larger than the voltage applied to the second photoelectric conversion layer.

[Item 4] In the imaging device according to any of Items 1 to 3, a ratio of the impedance of the first photoelectric conversion layer to the impedance of the second photoelectric conversion layer may be 44 or higher.

[Item 5] In the imaging device according to any of Items 1 to 4, the first material may contain electron-donating molecules, and the second material may contain electron-donating molecules.

[Item 6] In the imaging device according to any of Items 1 to 5, the first photoelectric conversion layer may further contain electron-accepting molecules, and the second photoelectric conversion layer may further contain electron-accepting molecules.

[Item 7] In the imaging device according to any of Items 1 to 6, the impedance of the first photoelectric conversion layer and the impedance of the second photoelectric conversion layer may be impedances at a frequency of 1 Hz with the first and second photoelectric conversion layers not irradiated with light.

[Item 8] In the imaging device according to any of Items 1 to 7, an external quantum efficiency of the photoelectric converter at the second wavelength corresponding to the absorption peak of the second material when the second voltage is applied between the first electrode and the second electrode may be larger than an external quantum efficiency of the photoelectric converter at the second wavelength when the first voltage is applied between the first electrode and the second electrode, and a difference between the external quantum efficiency of the photoelectric converter at the second wavelength when the second voltage is applied and the external quantum efficiency of the photoelectric converter at the second wavelength when the first voltage is applied may be larger than a difference between an external quantum efficiency of the photoelectric converter at the first wavelength corresponding to the absorption peak of the first material when the second voltage is applied and an external quantum efficiency of the photoelectric converter at the first wavelength when the first voltage is applied.

The external quantum efficiency of the photoelectric converter at the second wavelength when the second voltage is applied may be at least twice the external quantum efficiency of the photoelectric converter at the second wavelength when the first voltage is applied.

[Item 9] In the imaging device according to any of Items 1 to 8, the photoelectric converter may further include a mixture layer containing the first material and the second material.

[Item 10] In the imaging device according to any of Items 1 to 9, the at least one unit pixel cell may include a first unit pixel cell and a second unit pixel cell.

[Item 11] In the imaging device according to Item 10, the first unit pixel cell may include a first charge detection circuit that is electrically connected to the first electrode of the first unit pixel cell and detects the charges and a first resistor, and the second unit pixel cell may include a second charge detection circuit that is electrically connected to the first electrode of the second unit pixel cell and detects the charges and a second resistor having a resistance value different from the resistance value of the first resistor.

In this structure, while the same voltage is applied from the voltage application circuit to the first unit pixel cell and to the second unit pixel cell, an effective bias voltage applied between the first and second electrodes of the first unit pixel cell can differ from an effective bias voltage applied between the first and second electrodes of the second unit pixel cell.

[Item 12] The imaging device according to Item 10 or 11 may further include a color filter facing the second electrode of the first unit pixel cell.

With this structure, by changing the voltage applied between each first electrode and a corresponding second electrode, the image obtained can be switched, for example, between an RGB image and an image using red light and infrared light, green light and infrared light, and blue light and infrared light.

[Item 13] The imaging device according to Item 12 may further include an infrared pass filter facing the second electrode of the second unit pixel cell.

With this structure, unit pixel cells that output RGB image signals and also a unit pixel cell that outputs an image signal using infrared light can be present in the photosensitive region.

[Item 14] The imaging device according to Item 13 may further include an infrared cut filter facing the color filter.

With this structure, a camera that can acquire an RGB color image and an image using infrared light simultaneously can be provided.

[Item 15] In the imaging device according to any of Items 10 to 14, the second electrode of the first unit pixel cell and the second electrode of the second unit pixel cell may be a single continuous electrode.

[Item 16] In the imaging device according to any of Items 10 to 15, the first photoelectric conversion layer of the first unit pixel cell and the first photoelectric conversion layer of the second unit pixel cell may be a single continuous layer, and the second photoelectric conversion layer of the first unit pixel cell and the second photoelectric conversion layer of the second unit pixel cell may be a single continuous layer.

[Item 17] In the imaging device according to Item 1, the first wavelength may fall within the infrared wavelength range, and the second wavelength may fall within the visible wavelength range.

[Item 18] An imaging device according to Item 18 of the present disclosure includes:

at least one unit pixel cell including a photoelectric converter that converts incident light into electric charges.

The photoelectric converter includes a first electrode, a second electrode configured to transmit the incident light, a first photoelectric conversion layer disposed between the first electrode and the second electrode and containing a first material having an absorption peak at a first wavelength, and a second photoelectric conversion layer disposed between the first electrode and the second electrode and containing a second material having an absorption peak at a second wavelength different from the first wavelength.

An impedance of the first photoelectric conversion layer is larger than an impedance of the second photoelectric conversion layer.

One of the first and second wavelengths falls within a visible wavelength range, and the other of the first and second wavelengths falls within an infrared wavelength range.

The photoelectric converter has a characteristic such that, when a first voltage or a second voltage having a larger absolute value than the first voltage is selectively applied between the first electrode and the second electrode, an external quantum efficiency of the photoelectric converter at the second wavelength corresponding to the absorption peak of the second material when the second voltage is applied between the first electrode and the second electrode is larger than an external quantum efficiency of the photoelectric converter at the second wavelength when the first voltage is applied between the first electrode and the second electrode, and a difference between the external quantum efficiency of the photoelectric converter at the second wavelength when the second voltage is applied and the external quantum efficiency of the photoelectric converter at the second wavelength when the first voltage is applied is larger than a difference between an external quantum efficiency of the photoelectric converter at the first wavelength corresponding to the absorption peak of the first material when the second voltage is applied and an external quantum efficiency of the photoelectric converter at the first wavelength when the first voltage is applied.

[Item 19] An imaging device according to Item 19 of the present disclosure includes:

at least one unit pixel cell including a photoelectric converter that converts incident light into electric charges; and a voltage application circuit.

The photoelectric converter includes a first electrode, a second electrode configured to transmit the incident light, a first photoelectric conversion layer disposed between the first electrode and the second electrode and containing a first material having an absorption peak at a first wavelength, and a second photoelectric conversion layer disposed between the first electrode and the second electrode and containing a second material having an absorption peak at a second wavelength different from the first wavelength.

The voltage application circuit selectively applies a first voltage or a second voltage between the first electrode and the second electrode, and an absolute value of the second voltage is larger than an absolute value of the first voltage.

An external quantum efficiency of the photoelectric converter at the second wavelength corresponding to the absorption peak of the second material when the second voltage is applied between the first electrode and the second electrode is larger than an external quantum efficiency of the photoelectric converter at the second wavelength when the first voltage is applied between the first electrode and the second electrode.

A difference between the external quantum efficiency of the photoelectric converter at the second wavelength when the second voltage is applied and the external quantum efficiency of the photoelectric converter at the second wavelength when the first voltage is applied is larger than a difference between an external quantum efficiency of the photoelectric converter at the first wavelength corresponding to the absorption peak of the first material when the second voltage is applied and an external quantum efficiency of the photoelectric converter at the first wavelength when the first voltage is applied.

In the present disclosure, all or a part of any of circuit, unit, device, part or portion, or any of functional blocks in the block diagrams may be implemented as one or more of electronic circuits including, but not limited to, a semiconductor device, a semiconductor integrated circuit (IC) or an LSI (large scale integration). The LSI or IC can be integrated into one chip, or also can be a combination of plural chips. For example, functional blocks other than a memory may be integrated into one chip. The name used here is LSI or IC, but it may also be called system LSI, VLSI (very large scale integration), or ULSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part or portion are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

Embodiments of the present disclosure will be described with reference to the drawings. In examples described in the following embodiments, positive and negative charges (typically hole-electron pairs) are generated by photoelectric conversion, and the positive charges (e.g., holes) are detected as signal charges. The present disclosure is not limited to the following embodiments. One embodiment can be combined with another embodiment. In the following description, the same or similar components are denoted by the same reference numerals, and redundant description may be omitted.

(Structure of Imaging Device)

FIG. 1 schematically shows an exemplary circuit structure of an imaging device according to an embodiment of the present disclosure. The imaging device 101 shown in FIG. 1 includes a plurality of unit pixel cells 14 and peripheral circuits.

Four unit pixel cells 14 arranged in a 2×2 matrix are shown in FIG. 1. Specifically, in this example, the plurality of unit pixel cells 14 are arranged two-dimensionally, i.e., in row and column directions, on, for example, a semiconductor substrate and form a photosensitive region (a pixel region). It will be appreciated that the number of unit pixel cells 14 and their arrangement are not limited to those in the example shown in FIG. 1. For example, the imaging device 101 may be a line sensor. In this case, a plurality of unit pixel cells 14 are arranged one-dimensionally. In the present specification, the row direction is the direction in which the rows extend, and the column direction is the direction in which the columns extend. Specifically, the vertical direction in the drawing sheet in FIG. 1 is the column direction, and the horizontal direction is the row direction. The number of unit pixel cells 14 may be 1.

Each of the unit pixel cells 14 includes a photoelectric converter 10 and a charge detection circuit 25 electrically connected to the photoelectric converter 10. In this example, the photoelectric converter 10 includes a pixel electrode 50, a counter electrode 52, and a photoelectric conversion structure 51 disposed therebetween. The charge detection circuit 25 includes an amplification transistor 11, a reset transistor 12, and an address transistor 13.

As will be described later in detail, in the present embodiment of the present disclosure, the photoelectric conversion structure 51 in the photoelectric converter 10 includes a layered structure including first and second photoelectric conversion layers. The first photoelectric conversion layer contains a first material, and the second photoelectric conversion layer contains a second material. In one aspect of the present disclosure, the impedance of the first photoelectric conversion layer is higher than the impedance of the second photoelectric conversion layer. In this structure, by changing a voltage applied between the pixel electrode 50 and the counter electrode 52, the spectral sensitivity characteristics of the photoelectric converter 10 can be changed. By changing the spectral sensitivity characteristics of each unit pixel cell 14, its image acquirable wavelength band can be changed. In the present specification, for the sake of simplicity, the term "impedance" may be used to mean the "absolute value of the impedance." The impedance of the first photoelectric conversion layer and the impedance of the second photoelectric conversion layer may be impedances at a frequency of 1 Hz with the first and second photoelectric conversion layers not irradiated with light.

In another aspect of the present disclosure, the absolute value of the ionization potential of the first material is larger by at least 0.2 eV than the absolute value of the ionization potential of the second material. As will be described later, when the difference in ionization potential between the first and second materials is somewhat large, even if the difference in impedance between the first and second photoelectric conversion layers is small, the spectral sensitivity characteristics of the photoelectric converter 10 can be changed by changing the voltage applied between the pixel electrode 50 and the counter electrode 52.

In the structure exemplified in FIG. 1, the imaging device 101 includes a voltage application circuit 60. For example, the voltage application circuit 60 is connected to a plurality of bias voltage lines 16 provided for respective rows of unit pixel cells 14. In this example, the counter electrode 52 of the photoelectric converter 10 of each of the unit pixel cells 14 is connected to a corresponding one of the plurality of bias voltage lines 16.

The voltage application circuit 60 may be a circuit that can generate at least two voltages with different absolute values. During operation of the imaging device 101, the voltage application circuit 60 supplies, for example, one of the plurality of different voltages selectively to the unit pixel cells 14. The voltage supplied from the voltage application circuit 60 may be referred to as a switching voltage. For example, the voltage application circuit 60 supplies one of a first voltage VA and a second voltage VB larger in absolute value than the first voltage VA selectively to the unit pixel cells 14. The voltage application circuit 60 is not limited to a specific power supply circuit and may be a circuit that generates prescribed voltages or a circuit that converts a voltage supplied from another power source into a prescribed voltage. Typically, the voltage application circuit 60 is disposed outside the photosensitive region as part of the peripheral circuits.

In the present embodiment, by changing the potential of each counter electrode 52 through a corresponding bias voltage line 16, the voltage applied between the counter electrode 52 and a corresponding pixel electrode 50 is changed. By changing the voltage applied between the pixel electrode 50 and the counter electrode 52, the spectral sensitivity characteristics of the photoelectric converter 10 are changed. When each pixel electrode 50 collects holes as signal charges, it is only necessary that the potential of the pixel electrode 50 be lower than the potential of its counter electrode 52.

In each photoelectric conversion structure 51, the pixel electrode 50 collects positive or negative charges (e.g., holes) generated by photoelectric conversion. When holes are used as signal charges, voltages used as the first voltage VA and the second voltage VB are such that the potential of the counter electrode 52 is higher than the potential of the pixel electrode 50. The pixel electrode 50 is electrically connected to a gate electrode of the amplification transistor 11 in the charge detection circuit 25, and the signal charges (holes in this case) collected by the pixel electrode 50 are stored in a charge storage node 24 located between the pixel electrode 50 and the gate electrode of the amplification transistor 11. In the present embodiment, the signal charges are holes but may be electrons.

When the signal charges are stored in the charge storage node 24, a voltage corresponding to the amount of the signal charges is applied to the gate electrode of the amplification transistor 11. The amplification transistor 11 amplifies the applied voltage and outputs the resulting voltage as a signal voltage. The output from the amplification transistor 11 is read selectively by the address transistor 13. In the example shown in FIG. 1, the charge detection circuit 25 includes the reset transistor 12. As shown in FIG. 1, one of the source and drain electrodes of the reset transistor 12 is electrically connected to the pixel electrode 50. By switching the reset transistor 12 on, the signal charges stored in the charge storage node 24 can be reset. In other words, the reset transistor 12 can reset the potential of the gate electrode of the amplification transistor 11 and the potential of the pixel electrode 50 of the photoelectric converter 10.

As illustrated, power source lines 21, vertical signal lines 17, address signal lines 26, and reset signal lines 27 are connected to the respective unit pixel cells 14. The power source lines 21 are connected to the source or drain electrodes (typically the drain electrodes) of the amplification transistors 11 and supply a prescribed power source voltage (e.g., 3.3 V) to the unit pixel cells 14. The vertical signal lines 17 are connected to the source or drain electrodes (typically the source electrodes) of the address transistors 13. The address signal lines 26 are connected to the gate electrodes of the address transistors 13, and the reset signal lines 27 are connected to the gate electrodes of the reset transistors 12.

In the structure exemplified in FIG. 1, the imaging device 101 includes, in addition to the voltage application circuit 60, peripheral circuits including a vertical scanning circuit 15, a horizontal signal reading circuit 20, a plurality of column signal processing circuits 19, a plurality of load circuits 18, and a plurality of inverting amplifiers 22. The vertical scanning circuit 15 is referred to also as a row scanning circuit. The horizontal signal reading circuit 20 is referred to also as a column scanning circuit. The column signal processing circuits 19 are referred to also as column signal storage circuits.

The vertical scanning circuit 15 is connected to the address signal lines 26 and the reset signal lines 27, selects any of the rows of unit pixel cells 14, reads signal voltages from the selected unit pixel cells, and resets the potential of each of the pixel electrodes 50. The vertical signal lines 17 are provided for the respective columns of unit pixel cells 14, and each of the unit pixel cells 14 is connected to a corresponding one of the vertical signal lines 17. As illustrated, the load circuits 18 and the column signal processing circuits 19, as well as the vertical signal lines 17, are provided for the respective columns of unit pixel cells 14 and are each electrically connected to at least one unit pixel cell 14 disposed in a corresponding column through a corresponding vertical signal line 17. The load circuits 18 and the amplification transistors 11 form source follower circuits. The column signal processing circuits 19 perform noise suppression signal processing typified by correlated double sampling, analog-digital conversion (A/D conversion), etc. The horizontal signal reading circuit 20 is electrically connected to the plurality of column signal processing circuits 19. The horizontal signal reading circuit 20 sequentially reads signals from the plurality of column signal processing circuits 19 and outputs the signals to a horizontal common signal line (not shown).

The vertical scanning circuit 15 applies a row selection signal to the gate electrode of each address transistor 13 through its corresponding address signal line 26, and the row selection signal controls the address transistor 13 to switch it on and off. The row selection signal is applied to a row to be read, and this row is scanned and selected. Signal voltages are read from unit pixel cells 14 in the selected row through the respective vertical signal lines 17. The vertical signal lines 17 transmit the signal voltages read from the unit pixel cells 14 selected by the vertical scanning circuit 15 to the respective column signal processing circuits 19. Moreover, the vertical scanning circuit 15 applies a reset signal to the gate electrode of each reset transistor 12 through a corresponding reset signal line 27, and the reset signal controls the reset transistor 12 to switch it on and off. In this manner, signal charges in the charge storage node 24 of each unit pixel cell 14 with the reset transistor 12 switched on can be reset.

In this example, the peripheral circuits of the imaging device 101 include the plurality of inverting amplifiers 22 provided for the respective columns of unit pixel cells 14. As schematically shown in FIG. 1, negative input terminals of the inverting amplifiers 22 are connected to the respective vertical signal lines 17. Output terminals of the inverting amplifiers 22 are connected to respective feedback lines 23 provided for their respective columns of unit pixel cells 14. Each feedback line 23 is connected to unit pixel cells 14 that are connected to the negative input terminal of a corresponding inverting amplifier 22.

The output terminals of the inverting amplifiers 22 are connected through the feedback lines 23 to the drain or source electrodes of the respective reset transistors 12, which electrodes are not connected to any pixel electrodes 50. In each unit pixel cell 14, when the address transistor 13 is electrically continuous with the reset transistor 12, a feedback path is formed between the unit pixel cell 14 with the address transistor 13 and the reset transistor 12 switched on and a corresponding inverting amplifier 22. In this case, the potential of a positive input terminal of the inverting amplifier 22 is fixed to a prescribed potential. When the feedback path is formed, the voltage of a corresponding vertical signal line 17 converges to an input voltage Vref to the negative input terminal of the inverting amplifier 22. In other words, when the feedback path is formed, the voltage of the charge storage node 24 is reset such that the voltage of the vertical signal line 17 is equal to Vref. The voltage Vref used may be any voltage within the range of from the power source voltage to the ground voltage (0 V). The inverting amplifiers 22 may be referred to also as feedback amplifiers.

(Device Structure of Unit Pixel Cell)

Figure 2:
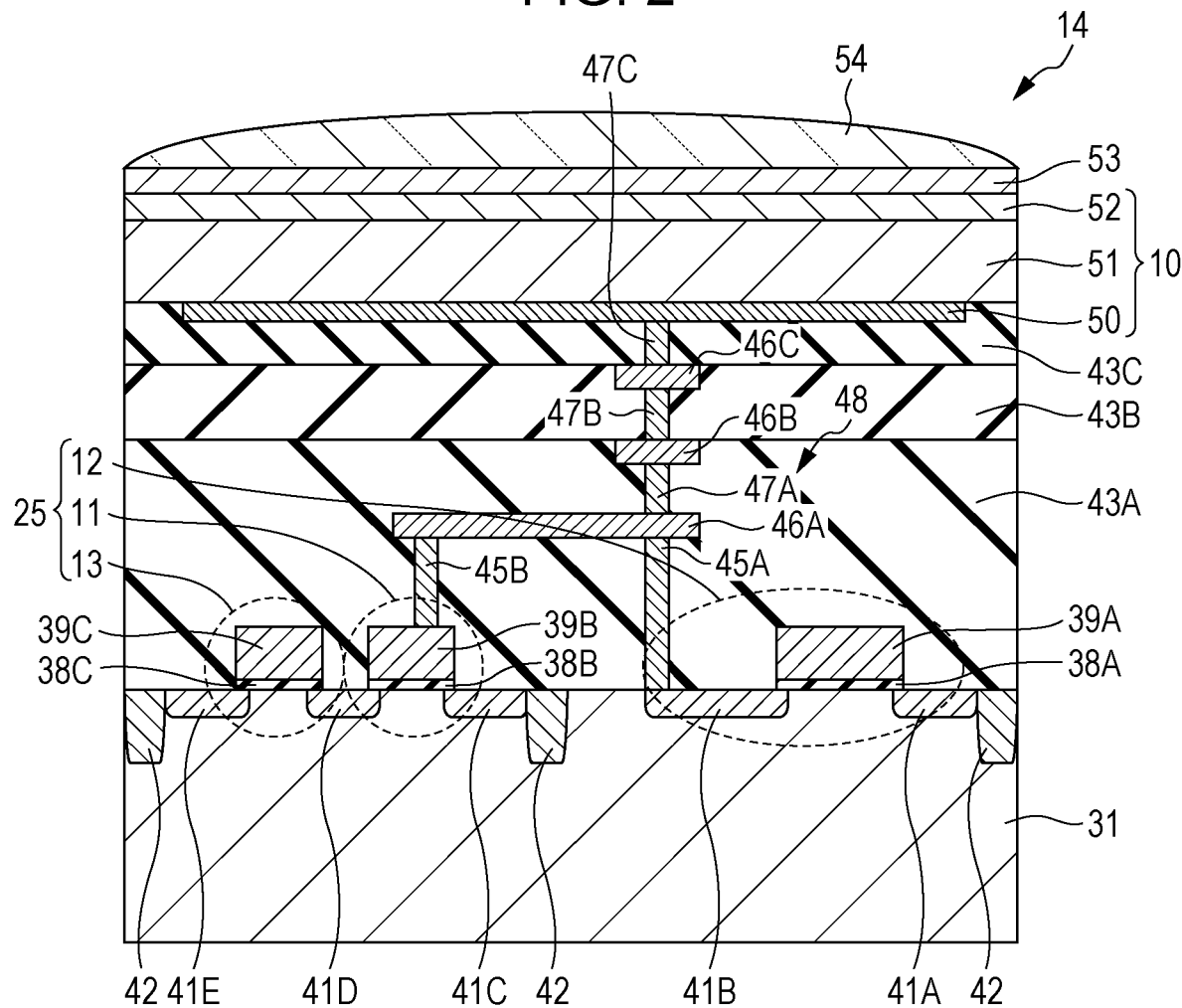
FIG. 2 is a schematic cross-sectional view showing an exemplary device structure of a unit pixel cell in the imaging device according to the embodiment of the present disclosure.

FIG. 2 shows an exemplary device structure of a unit pixel cell 14 in the imaging device 101 according to the embodiment of the present disclosure.

As described above, the unit pixel cell 14 includes the charge detection circuit 25 and the photoelectric converter 10. The amplification transistor 11, the reset transistor 12, and the address transistor 13 in the charge detection circuit 25 are formed on a semiconductor substrate 31. The semiconductor substrate 31 includes, for example, n-type impurity regions 41A, 41B, 41C, 41D, and 41E. In this example, interlayer insulating layers 43A, 43B, and 43C are stacked on the surface of the semiconductor substrate 31, and the photoelectric converter 10 is disposed on the interlayer insulating layer 43C. Although not shown in FIG. 2, the vertical scanning circuit 15, the horizontal signal reading circuit 20, the column signal processing circuits 19, the load circuits 18, the inverting amplifiers 22, and the voltage application circuit 60 may be formed on the semiconductor substrate 31. It will be appreciated that part or all of these components may be disposed on a substrate different from the semiconductor substrate 31.

The semiconductor substrate 31 is, for example, a p-type silicon substrate. The "semiconductor substrate" in the present specification is not limited to a substrate formed entirely of a semiconductor and may be, for example, an insulating substrate having a semiconductor layer on its surface to be irradiated with light. In the following description, the amplification transistor 11, the reset transistor 12, and the address transistor 13 exemplified are N-channel MOSFETs.

The amplification transistor 11 includes the n-type impurity regions 41C and 41D serving as drain and source regions, respectively, a gate insulating layer 38B located on the semiconductor substrate 31, and a gate electrode 39B located on the gate insulating layer 38B. Although not illustrated in FIG. 2, one of the power source lines 21 described above is connected to the n-type impurity region 41C serving as the drain region of the amplification transistor 11.

The reset transistor 12 includes the n-type impurity regions 41B and 41A serving as drain and source regions, respectively, a gate insulating layer 38A located on the semiconductor substrate 31, and a gate electrode 39A located on the gate insulating layer 38A. Although not illustrated in FIG. 2, one of the feedback lines 23 described above is connected to the n-type impurity region 41A serving as the source region of the reset transistor 12.

The address transistor 13 includes the n-type impurity regions 41D and 41E serving as drain and source regions, respectively, a gate insulating layer 38C located on the semiconductor substrate 31, and a gate electrode 39C located on the gate insulating layer 38C. In this example, the amplification transistor 11 and the address transistor 13 share the n-type impurity region 41D. Since the n-type impurity region 41D is shared, the amplification transistor 11 and the address transistor 13 are connected in series. Although not illustrated in FIG. 2, one of the vertical signal lines 17 described above is connected to the n-type impurity region 41E serving as the source region of the address transistor 13.

The gate insulating layer 38B of the amplification transistor 11, the gate insulating layer 38A of the reset transistor 12, and the gate insulating layer 38C of the address transistor 13 are typically disposed in the same layer. Similarly, the gate electrode 39B of the amplification transistor 11, the gate electrode 39A of the reset transistor 12, and the gate electrode 39C of the address transistor 13 are typically disposed in the same layer.

In the semiconductor substrate 31, element isolation regions 42 are provided between the unit pixel cell 14 and its adjacent unit pixel cells 14 and between the amplification transistor 11 and the reset transistor 12. The element isolation regions 42 electrically isolate the unit pixel cell 14 from its adjacent unit pixel cells 14. Moreover, leakage of signal charges stored in the charge storage node 24 is prevented.

In the structure exemplified in FIG. 2, a connection member 48 that electrically connects the pixel electrode 50 of the photoelectric converter 10 to the gate electrode 39B of the amplification transistor 11 is disposed in the layered structure including the interlayer insulating layers 43A, 43B, and 43C. In this case, the connection member 48 includes wiring lines 46A, 46B, and 46C, plugs 47A, 47B, and 47C, and contact plugs 45A and 45B. As illustrated, the plug 47C connects the pixel electrode 50 to the wiring line 46C, and the contact plug 45B connects the gate electrode 39B to the wiring line 46A.

The contact plug 45A that connects the n-type impurity region 41B of the reset transistor 12 to the wiring line 46A is disposed in the interlayer insulating layer 43A. The contact plug 45A and the contact plug 45B are connected to each other through the wiring line 46A. Specifically, in this case, the pixel electrode 50 is electrically connected also to the n-type impurity region 41B in the semiconductor substrate 31.

As described above, the signal charges collected by the pixel electrode 50 are stored in the charge storage node 24. The charge storage node 24 includes, as a part thereof, the connection member 48 that electrically connects the pixel electrode 50 to the gate electrode 39B of the amplification transistor 11. In this case, since the pixel electrode 50 is electrically connected also to the n-type impurity region 41B in the semiconductor substrate 31, the n-type impurity region 41B functions as a charge storage region that stores the signal charges. Specifically, the charge storage node 24 includes the pixel electrode 50, the gate electrode 39B, and the n-type impurity region 41B and further includes the plugs 47A, 47B, and 47C, the contact plugs 45A and 45B, and the wiring lines 46A, 46B, and 46C that electrically connect the pixel electrode 50, the gate electrode 39B, and the n-type impurity region 41B. The charge detection circuit 25 including, as a part thereof, the amplification transistor 11 having the gate electrode 39B connected to the connection member 48 detects the signal charges collected by the pixel electrode 50 and stored in the charge storage node 24 and outputs a signal voltage.

The photoelectric converter 10 on the interlayer insulating layer 43C includes the light-transmitting counter electrode 52, the photoelectric conversion structure 51, and the pixel electrode 50 located closer to the semiconductor substrate 31 than the counter electrode 52. As schematically shown in FIG. 2, the photoelectric conversion structure 51 is sandwiched between the counter electrode 52 and the pixel electrode 50. Light having passed through the counter electrode 52 is incident on the photoelectric conversion structure 51. The details of the structure of the photoelectric conversion structure 51 will be described later.

A transparent conducting oxide (TCO) with high near-infrared and visible light transmittance and small resistance may be used as the material of the counter electrode 52. Examples of the TCO used include indium tin oxide (ITO), indium zinc oxide (IZO), aluminum zinc oxide (AZO), fluorine-doped tin oxide (FTO), $SnO_2$, $TiO_2$, and $ZnO_2$. A metal thin film such as a Au thin film may be used as the counter electrode 52. The terms "light-transmitting" and "transparent as used herein mean that at least part of light in the detection wavelength range is allowed to pass through. Although not shown in FIG. 2, one of the bias voltage lines 16 described above is connected to the counter electrode 52. During operation of the imaging device 101, a prescribed bias voltage is applied to the counter electrode 52 through the bias voltage line 16.

The pixel electrode 50 disposed on the interlayer insulating layer 43C is formed from a metal such as aluminum or copper or polysilicon doped with impurities to impart electric conductivity. The pixel electrodes 50 in the plurality of unit pixel cells 14 are spaced apart from each other, and therefore the pixel electrode 50 of each unit pixel cell 14 is electrically isolated from pixel electrodes 50 of its adjacent unit pixel cells 14.

As shown in FIG. 2, the unit pixel cell 14 may have an optical filter 53 that faces the counter electrode 52 of the photoelectric converter 10. The optical filter 53 selectively passes through or blocks light in a specific wavelength range that is contained in the light incident on the unit pixel cell 14. A protective layer may be disposed between the counter electrode 52 and the optical filter 53. A microlens 54 may be disposed on the optical filter 53 or the protective layer.

The imaging device 101 can be manufactured using a general semiconductor manufacturing process. In particular, when a silicon substrate is used as the semiconductor substrate 31, the imaging device 101 can be manufactured using various silicon semiconductor processes.

(Photoelectric Conversion Structure)

Figure 3:
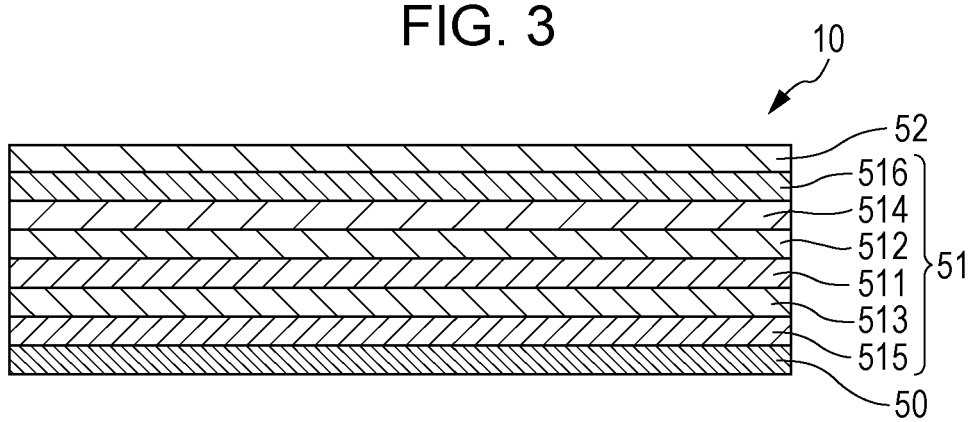
FIG. 3 is a schematic cross-sectional view showing an example of a photoelectric converter.

FIG. 3 shows an example of a cross-sectional structure of the photoelectric converter 10. As described above, the photoelectric converter 10 includes the pixel electrode 50, the counter electrode 52, and the photoelectric conversion structure 51 sandwiched therebetween. Typically, the photoelectric conversion structure 51 includes a plurality of organic material-containing layers. In the structure exemplified in FIG. 3, the photoelectric conversion structure 51 includes a layered structure including a first photoelectric conversion layer 511 and a second photoelectric conversion layer 512. As illustrated, in this example, the second photoelectric conversion layer 512 is located between the first photoelectric conversion layer 511 and the counter electrode 52.

In the structure exemplified in FIG. 3, the photoelectric conversion structure 51 further includes an electron blocking layer 515 and a hole transport layer 513 that are disposed between the first photoelectric conversion layer 511 and the pixel electrode 50. The electron blocking layer 515 is adjacent to the pixel electrode 50, and the hole transport layer 513 is adjacent to the first photoelectric conversion layer 511. The photoelectric conversion structure 51 further includes an electron transport layer 514 and a hole blocking layer 516 that are disposed between the second photoelectric conversion layer 512 and the counter electrode 52. The hole blocking layer 516 is adjacent to the counter electrode 52, and the electron transport layer 514 is adjacent to the second photoelectric conversion layer 512.

In this structure, positive and negative charges are generated by photoelectric conversion, and the positive charges (e.g., holes) are detected as signal charges. During operation of the imaging device 101, a switching voltage is supplied from the voltage application circuit 60 to the counter electrode 52 such that the potential of the counter electrode 52 is higher than the potential of the pixel electrode 50. For example, the voltage application circuit 60 supplies, to the counter electrode 52, one of the first voltage VA and the second voltage VB with different absolute values (|VB|>|VA|) as the switching voltage. Which of the first voltage VA and the second voltage VB is supplied to the counter electrode 52 is determined, for example, by an instruction from the operator of the imaging device 101 or an instruction from another controller included in the imaging device 101. Specific examples of the operation of the imaging device 101 will be described later.

The electron blocking layer 515 shown in FIG. 3 is provided for the purpose of reducing a dark current caused by injection of electrons from the pixel electrode 50, and the hole blocking layer 516 is provided for the purpose of reducing a dark current caused by injection of holes from the counter electrode 52. The hole transport layer 513 is provided for the purpose of efficiently transporting positive charges generated in the first photoelectric conversion layer 511 and/or the second photoelectric conversion layer 512 to the pixel electrode 50. The electron transport layer 514 is provided for the purpose of efficiently transporting electrons generated in the first photoelectric conversion layer 511 and/or the second photoelectric conversion layer 512 to the counter electrode 52. The materials forming the electron blocking layer 515, the hole blocking layer 516, the hole transport layer 513, and the electron transport layer 514 may be selected from known materials in consideration of bonding strength with adjacent layers, stability, the difference in ionization potential, the difference in electron affinity, etc. At least one of the materials forming the electron blocking layer 515, the hole blocking layer 516, the hole transport layer 513, and the electron transport layer 514 may be the material for forming the first photoelectric conversion layer 511 or the material for forming the second photoelectric conversion layer 512.

The first photoelectric conversion layer 511 contains a first material (typically a semiconductor material). The second photoelectric conversion layer 512 contains a second material (typically a semiconductor material). In some aspects, the impedance of the first photoelectric conversion layer 511 per unit thickness differs from the impedance of the second photoelectric conversion layer 512 per unit thickness. In some aspects of the present disclosure, the impedance of the first photoelectric conversion layer 511 per unit thickness is larger than the impedance of the second photoelectric conversion layer 512 per unit thickness. The impedance of each photoelectric conversion layer depends on its thickness. When a photoelectric conversion layer contains a plurality of materials, its impedance depends also on the volume ratio of these materials in the photoelectric conversion layer. In the embodiment of the present disclosure, among the plurality of photoelectric conversion layers included in the layered structure, a layer having a lager impedance can be used as the first photoelectric conversion layer 511. The impedance of the first photoelectric conversion layer and the impedance of the second photoelectric conversion layer may be impedances at a frequency of 1 Hz with the first and second photoelectric conversion layers not irradiated with light.

(Switching of Spectral Sensitivity Characteristics by Changing Bias Voltage Using Difference in Impedance)

Suppose that the photoelectric conversion structure 51 includes the first photoelectric conversion layer 511 and the second photoelectric conversion layer 512 that differ in impedance. In this case, when a bias voltage is applied between the pixel electrode 50 and the counter electrode 52, voltages (or electric fields) proportional to the impedances of the first and second photoelectric conversion layers 511 and 512 are applied to the first and second photoelectric conversion layers 511 and 512. The inventors have found that, by changing the bias voltage applied to a photoelectric conversion structure including photoelectric conversion layers with different impedances, external quantum efficiency (E.Q.E.) in a certain wavelength range can be changed. In other words, the inventors have found that the spectral sensitivity characteristics of a unit pixel cell having the above photoelectric conversion structure in the photoelectric converter can be electrically changed. For example, an increase in the external quantum efficiency of the photoelectric conversion structure 51 at a wavelength corresponding to the absorption peak of the second material when the second voltage VB is applied with respect to the external quantum efficiency when the first voltage VA is applied can be larger than an increase in the external quantum efficiency of the photoelectric conversion structure 51 at a wavelength corresponding to the absorption peak of the first material when the second voltage VB is applied with respect to the external quantum efficiency when the first voltage VA is applied.

Suppose, for example, that Z1>Z2, where Z1 is the impedance of the first photoelectric conversion layer 511, and Z2 is the impedance of the second photoelectric conversion layer 512. In this case, the voltage applied to the first photoelectric conversion layer 511 is larger than the voltage applied to the second photoelectric conversion layer 512. Therefore, even when the bias between the pixel electrode 50 and the counter electrode 52 is small, i.e., even when the first voltage VA is supplied to the counter electrode 52, an electric field sufficient to allow the charges generated by photoelectric conversion to move to the electrodes can be applied to the first photoelectric conversion layer 511. Specifically, the positive and negative charges generated by photoelectric conversion can reach the pixel electrode 50 and the counter electrode 52, respectively. The signal charges generated by irradiation of the first photoelectric conversion layer 511 with light are collected by the pixel electrode 50 and stored in the charge storage region.

The electric field applied to the second photoelectric conversion layer 512 is lower than the electric field applied to the first photoelectric conversion layer 511. Therefore, when the first voltage VA with a relatively small absolute value is supplied to the counter electrode 52, the electric field applied to the second photoelectric conversion layer 512 may be lower than the electric field necessary to allow the signal charges generated by irradiation of the second photoelectric conversion layer 512 with light to reach the pixel electrode 50. If the signal charges do not reach the pixel electrode 50, the signal charges generated in the second photoelectric conversion layer 512 are not stored in the charge storage region. Therefore, the unit pixel cell 14 does not exhibit sufficient sensitivity to light in a wavelength range corresponding to the absorption spectrum of the materials (particularly the second material) forming the second photoelectric conversion layer 512.

When the voltage applied between the counter electrode 52 and the pixel electrode 50 is increased, the voltage applied to the second photoelectric conversion layer 512 increases. Specifically, by supplying the second voltage VB with a larger absolute value to the counter electrode 52, the electric field applied to the second photoelectric conversion layer 512 increases, and the signal charges are allowed to reach the pixel electrode 50. Therefore, the unit pixel cell 14 exhibits sensitivity not only to light in a wavelength range corresponding to the absorption spectrum of the materials (particularly the first material) forming the first photoelectric conversion layer 511 but also to light in a wavelength range corresponding to the absorption spectrum of the materials (particularly the second material) forming the second photoelectric conversion layer 512.

As described above, when the layered structure including the first photoelectric conversion layer 511 and the second photoelectric conversion layer 512 having a lower impedance than the first photoelectric conversion layer 511 is used, the spectral sensitivity characteristics can be changed by changing the bias voltage supplied to the counter electrode 52. The ratio of the impedance of the first photoelectric conversion layer 511 to the impedance of the second photoelectric conversion layer 512 is typically within the range of from 100 to $10^{10}$. According to studies by the inventors, when the ratio of the impedance of the first photoelectric conversion layer 511 to the impedance of the second photoelectric conversion layer 512 is, for example, 44 or more, the spectral sensitivity characteristics can be changed by changing the bias voltage. The ratio of the impedance of the first photoelectric conversion layer 511 to the impedance of the second photoelectric conversion layer 512 may be 190 or more. The impedance of the first photoelectric conversion layer and the impedance of the second photoelectric conversion layer may be impedances at a frequency of 1 Hz with the first and second photoelectric conversion layers not irradiated with light.

As will be described below, a combination of the first and second materials may be, for example, a combination of a material having a high absorption coefficient in the visible range and a material having a high absorption coefficient in the infrared range. With such a combination of materials, an imaging device that can acquire one or both of information about the illuminance of visible light and information about the illuminance of infrared light can be provided.

Typically, each of the first photoelectric conversion layer 511 and the second photoelectric conversion layer 512 contains electron-donating p-type molecules and electron-accepting n-type molecules.

The first and second materials used may be, for example, electron-donating molecules. Typical examples of the electron-donating molecules include organic p-type semiconductors, and representative examples of such organic p-type semiconductors include hole transporting organic materials having electron-donating properties. Examples of the organic p-type semiconductor include: triarylamine compounds such as DTDCTB (2-{[7-(5-N,N-ditolylaminothiophen-2-yl)-2,1,3-benzothiadiazol-4-yl]methylene}malononitrile); benzidine compounds; pyrazoline compounds; styrylamine compounds; hydrazone compounds; triphenylmethane compounds; carbazole compounds; polysilane compounds; thiophene compounds such as α-sexithiophene (hereinafter referred to as "α-6T") and P3HT (poly(3-hexylthiophene)); phthalocyanine compounds; cyanine compounds; merocyanine compounds; oxonol compounds; polyamine compounds; indole compounds; pyrrole compounds; pyrazole compounds; polyarylene compounds; condensed aromatic carbocyclic compounds (naphthalene derivatives, anthracene derivatives, phenanthrene derivatives, tetracene derivatives such as rubrene, pyrene derivatives, perylene derivatives, and fluoranthene derivatives); and metal complexes having as ligands nitrogen-containing heterocycle compounds. Examples of the phthalocyanine compound include copper phthalocyanine (CuPc), subphthalocyanine (SubPc), aluminum chloride phthalocyanine (ClAlPc), $Si(OSiR_3)_2Nc$ (where R represents an alkyl group having 1 to 18 carbon atoms, and Nc represents naphthalocyanine), tin naphthalocyanine (SnNc), and lead phthalocyanine (PbPc). The electron-donating organic semiconductor is not limited to the above compounds, and any organic compound having a lower ionization potential than an organic compound used as the n-type (electron-accepting) compound may be used as the electron-donating organic semiconductor. The ionization potential is the difference between the vacuum level and the energy level of the highest occupied molecular orbital (HOMO).

Typical examples of the electron-accepting molecules include organic n-type semiconductors, and representative examples of such organic p-type semiconductors include electron transporting organic compounds having electron-accepting properties. Examples of the organic n-type semiconductor include: fullerenes such as $C_{60}$ and $C_{70}$; fullerene derivatives such as phenyl-$C_{61}$-butyric acid methyl ester (PCBM); condensed aromatic carbocyclic compounds (naphthalene derivatives, anthracene derivatives, phenanthrene derivatives, tetracene derivatives, pyrene derivatives, perylene derivatives, and fluoranthene derivatives); 5 to 7-membered heterocyclic compounds containing a nitrogen atom, an oxygen atom, or a sulfur atom (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine); subphthalocyanine (SubPc); polyarylene compounds; fluorene compounds; cyclopentadiene compounds; silyl compounds; perylenetetracarboxylic diimide compounds (PTCDI), and metal complexes having as ligands nitrogen-containing heterocycle compounds. The electron-accepting organic semiconductor is not limited to the above compounds, and any organic compound having a higher electron affinity than an organic compound used as the p-type (electron-donating) compound may be used as the electron-accepting organic semiconductor. The electron affinity is the difference between the vacuum level and the energy level of the lowest unoccupied molecular orbital (LUMO).

Figure 4A:
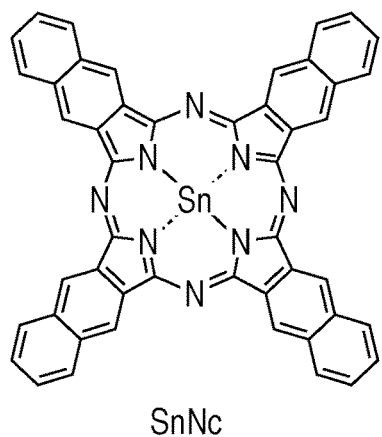
FIG. 4A is an illustration showing an example of a material usable for a photoelectric conversion layer.
Figure 4B:
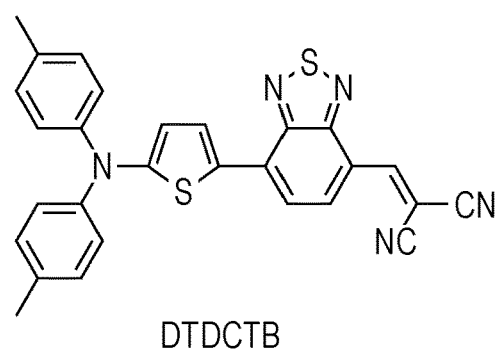
FIG. 4B is an illustration showing another example of the material usable for the photoelectric conversion layer.
Figure 4C:
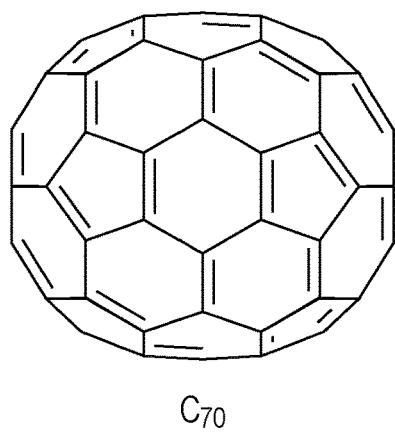
FIG. 4C is an illustration showing another example of the material usable for the photoelectric conversion layer.

FIG. 4A shows the structural formula of SnNc. FIG. 4B shows the structural formula of DTDCTB, and FIG. 4C shows the structural formula of $C_{70}$. The above examples are not limitations, and any organic compound or organic molecules that can be formed into a film by a wet or dry method can be used as the material forming the first photoelectric conversion layer 511 or the material forming the second photoelectric conversion layer 512, irrespective of whether they are low-molecular weight molecules or high-molecular weight molecules.

By using materials suitable for a detection wavelength range as the first and second materials, the photoelectric conversion structure 51 obtained can have sensitivity in the desired wavelength range. For example, a material having an absorption peak in the visible range may be used as the first material, and a material having an absorption peak in the infrared range may be used as the second material. DTDCTB described above has an absorption peak at a wavelength of about 700 nm, and CuPc and SubPc have absorption peaks at wavelengths of about 620 nm and about 580 nm, respectively. $Si(OSiR_3)_2Nc$ has an absorption peak at a wavelength of about 790 nm. Rubrene has an absorption peak at a wavelength of about 530 nm, and α-6T has an absorption peak at a wavelength of about 440 nm. The absorption peaks of these materials fall within the visible wavelength range, and these materials can be used as, for example, the first material. SnNc has an absorption peak at a wavelength of about 870 nm, and ClAlPc has an absorption peak at a wavelength of about 750 nm. The absorption peaks of these materials fall within the infrared wavelength range, and these materials can be used as, for example, the second material. Of course, a material having an absorption peak in the infrared range may be used as the first material, and a material having an absorption peak in the visible range may be used as the second material.

In the present specification, the visible wavelength range is a wavelength range of, for example, 380 nm or more and less than 750 nm, and the infrared wavelength range is a wavelength range of, for example, 750 nm or more. The near-infrared wavelength range is a wavelength range of, for example, 750 nm or more and less than 1,400 nm. In the present specification, all electromagnetic waves including infrared rays and ultraviolet rays are referred to as "light" for the sake of convenience. For example, when a material having an absorption peak at a first wavelength in the visible range is used as the first material and a material having an absorption peak at a second wavelength in the infrared range is used as the second material, the sensitivity in the infrared range can be electrically changed.

Suppose, for example, that the impedance Z1 of the first photoelectric conversion layer 511 using, as the first material, a material having a high absorption coefficient for visible light is higher than the impedance Z2 of the second photoelectric conversion layer 512 using, as the second material, a material having a high absorption coefficient for infrared light (Z1>Z2). The impedance of the first photoelectric conversion layer and the impedance of the second photoelectric conversion layer may be impedances at a frequency of 1 Hz with the first and second photoelectric conversion layers not irradiated with light. In this case, when the voltage applied between the counter electrode 52 and the pixel electrode 50 is equal to or lower than a threshold value, the photoelectric converter 10 exhibits higher sensitivity in the visible range. Therefore, image signals using visible light can be obtained. When the voltage applied between the counter electrode 52 and the pixel electrode 50 is higher than the threshold value, the photoelectric converter 10 exhibits sensitivity in the visible range and the infrared range. This allows image signals using visible light and infrared light to be acquired. In other words, as for the voltage applied between the counter electrode 52 and the pixel electrode 50, the relation |V1|<|V2| holds, where V1 is a voltage at which an image can be acquired using visible light, and V2 is a voltage at which an image can be acquired using visible light and infrared light.

Suppose, in contrast, that the impedance Z1 of the first photoelectric conversion layer 511 is lower than the impedance Z2 of the second photoelectric conversion layer 512 (Z1<Z2). In this case, when the voltage applied between the counter electrode 52 and the pixel electrode 50 is equal to or lower than a threshold value, the photoelectric converter 10 can have higher sensitivity in the infrared range. Therefore, the imaging device 101 can acquire image signals using infrared light. When the voltage applied between the counter electrode 52 and the pixel electrode 50 exceeds the threshold value, the photoelectric converter 10 has sensitivity in the visible range and the infrared light. This allows image signals using visible light and infrared light to be acquired. In this case, as for the voltage applied between the counter electrode 52 and the pixel electrode 50, the relation |V3|<|V4| holds, where V3 is a voltage at which an image can be acquired using visible light, and V4 is a voltage at which an image can be acquired using visible light and infrared light. It should be noted that the image acquirable wavelength band can be changed by changing the voltage applied between the counter electrode 52 and the pixel electrode 50.

When the first photoelectric conversion layer 511 and the second photoelectric conversion layer 512 each contain only one type of organic material, they may not have the desired sensitivity characteristics. In this case, one or both of the first photoelectric conversion layer 511 and the second photoelectric conversion layer 512 may be formed from a mixture of two or more organic materials. Alternatively, one or both of the first photoelectric conversion layer 511 and the second photoelectric conversion layer 512 may be formed by stacking two or more layers containing different organic materials. The first photoelectric conversion layer 511 and/or the second photoelectric conversion layer 512 may be, for example, a bulk heterojunction structure layer including a p-type semiconductor and an n-type semiconductor. The bulk heterojunction structure is described in detail in Japanese Patent No. 5553727. For reference purposes, the entire contents of Japanese Patent No. 5553727 are incorporated herein by reference. The first photoelectric conversion layer 511 and the second photoelectric conversion layer 512 may contain an inorganic semiconductor material such as amorphous silicon. The first photoelectric conversion layer 511 and/or the second photoelectric conversion layer 512 may include a layer formed from an organic material and a layer formed from an inorganic material.

Figure 5:
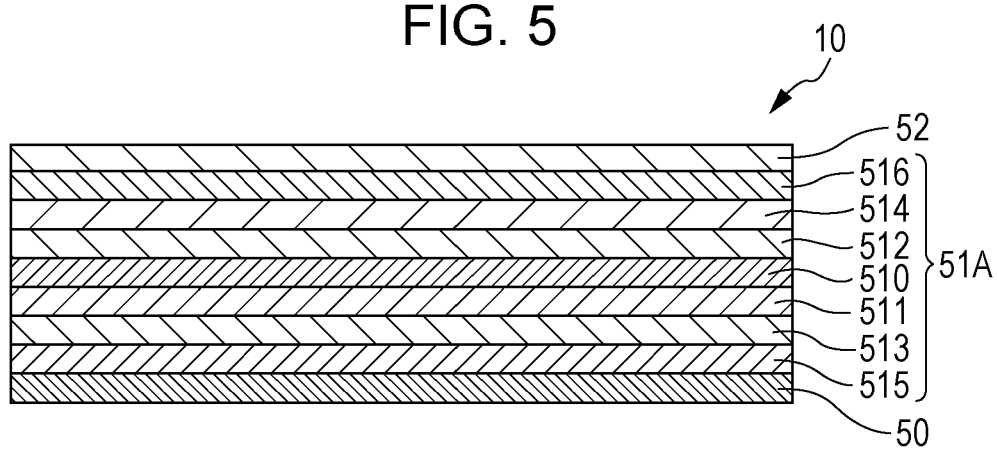
FIG. 5 is a schematic cross-sectional view showing another example of the photoelectric converter.

FIG. 5 shows another example of the cross-sectional structure of the photoelectric converter 10. The photoelectric conversion structure 51A shown in FIG. 5 includes the first photoelectric conversion layer 511, a mixture layer 510, and the second photoelectric conversion layer 512. The mixture layer 510 contains at least the first and second materials and is located between the first photoelectric conversion layer 511 and the second photoelectric conversion layer 512. FIG. 5 and also FIG. 3 are merely schematic diagrams, and the boundaries between the layers included in the photoelectric conversion structure may not be strictly defined. This is also the case for other cross-sectional views in the present disclosure. According to studies by the inventors, when the layer structure including the first photoelectric conversion layer 511 and the second photoelectric conversion layer 512 is not formed and only a layer containing a mixture of the first and second materials used as electron-accepting organic semiconductors and an electron-donating organic semiconductor is used as the photoelectric conversion structure, the external quantum efficiency in both the wavelength range corresponding to the absorption spectrum of the first material and the wavelength range corresponding to the absorption spectrum of the second material can increase as the bias is increased. Therefore, the effect of changing the spectral sensitivity by changing the bias voltage may not be obtained.

As described above, the structure of the photoelectric converter 10 is not limited to the structure shown in FIG. 3. For example, the arrangement of the first photoelectric conversion layer 511 and the second photoelectric conversion layer 512 may be reversed from the arrangement shown in FIGS. 3 and 5. Positive and negative charges are generated in the photoelectric conversion structure 51. When the negative charges (typically electrons) are used as the signal charges, a hole blocking layer and an electron transport layer may be used instead of the electron blocking layer 515 and the hole transport layer 513, and a hole transport layer and an electron blocking layer may be used instead of the electron transport layer 514 and the hole blocking layer 516. (Switching of Spectral Sensitivity Characteristics by Changing Bias Voltage Using Difference in Ionization Potential)

The inventors have also found that, even when the impedance of the first photoelectric conversion layer 511 is equal to or lower than the impedance of the second photoelectric conversion layer 512, the spectral sensitivity characteristics can be changed by changing the applied bias voltage when the difference in ionization potential between the first and second materials is somewhat large.

Figure 6:
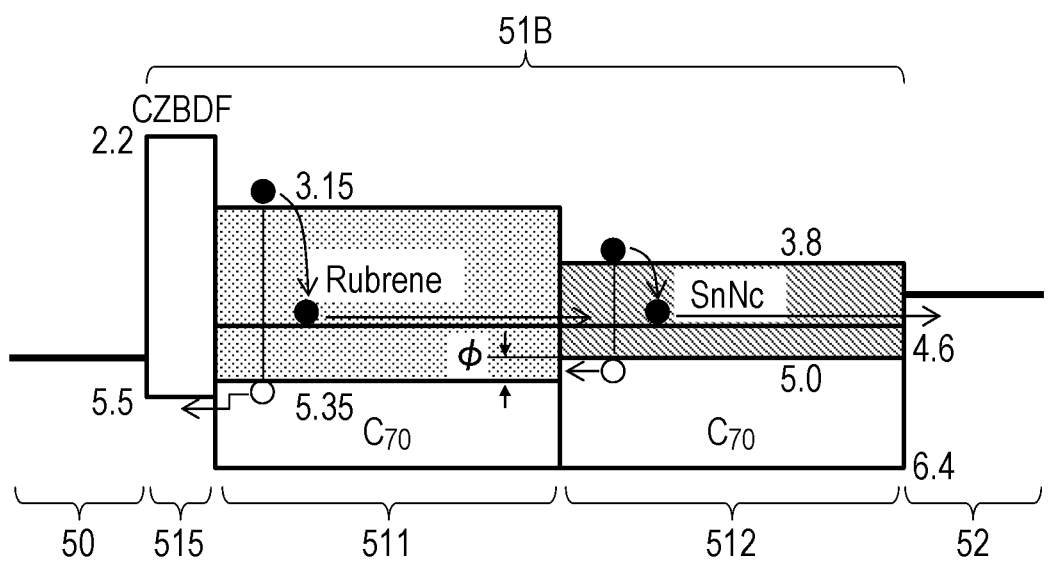
FIG. 6 is an energy diagram in a still another example of the photoelectric converter.

FIG. 6 is an energy diagram in a still another structural example of the photoelectric converter. Rectangles in FIG. 6 each schematically show the LUMO and HOMO of a material. Numerical values near the upper and lower sides of each rectangle represent the electron affinity and ionization potential of a corresponding material. Thick horizontal lines in FIG. 6 schematically represent exemplary Fermi levels of the counter electrode 52 and the pixel electrode 50.

Figure 7:
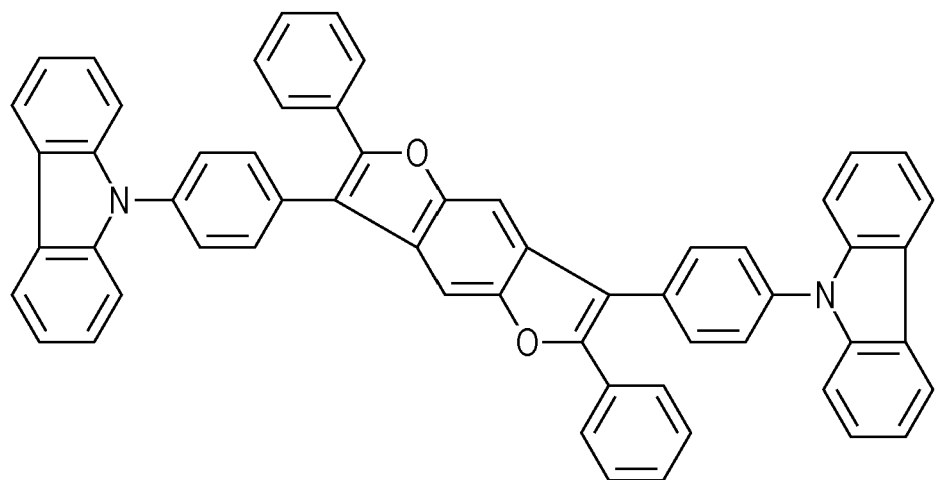
FIG. 7 is an illustration showing the structural formula of CZBDF.

In the structure shown in FIG. 6, the photoelectric conversion structure 51B has a layered structure in which the electron blocking layer 515, the first photoelectric conversion layer 511, and the second photoelectric conversion layer 512 are stacked from the pixel electrode 50 toward the counter electrode 52. In this example, rubrene, SnNc, and bis(carbazolyl)benzodifuran (CZBDF), which is an ambipolar organic semiconductor, are used as the first material, the second material, and the material of the electron blocking layer 515, respectively. FIG. 7 shows the structural formula of CZBDF. As schematically shown in FIG. 6, the first photoelectric conversion layer 511 and the second photoelectric conversion layer 512 each contain $C_{70}$ serving as an electron-accepting organic semiconductor. The first photoelectric conversion layer 511 in this example generates charge pairs through photoelectric conversion when irradiated with visible light, and the second photoelectric conversion layer 512 generates charge pairs through photoelectric conversion when irradiated with infrared light. In FIG. 6, open circles "○" and filled circles "●" represent positive and negative charges, respectively, generated by photoelectric conversion.

As has been described above, when positive charges are collected by the pixel electrode 50, the first voltage VA is supplied to, for example, the counter electrode 52, so that the potential of the counter electrode 52 is higher than the potential of the counter electrode 52. In this state, when visible light is incident on the first photoelectric conversion layer 511 and positive and negative charges are generated in the first photoelectric conversion layer 511, the positive charges are collected by the pixel electrode 50. Specifically, in this state, the signal charges generated by the irradiation with visible light are stored in the charge storage region, and the unit pixel cell 14 has sensitivity in the visible wavelength range. The negative charges transfer from the LUMO level of rubrene to the LUMO level of $C_{70}$ and move toward the counter electrode 52 along the electric field between the pixel electrode 50 and the counter electrode 52. Since $C_{70}$ is used as the electron-accepting organic semiconductor for the first photoelectric conversion layer 511 and also for the second photoelectric conversion layer 512, the negative charges transferred to the LUMO level of $C_{70}$ can move to the counter electrode 52 and be collected by the counter electrode 52.

Suppose that infrared light is incident on the second photoelectric conversion layer 512 and positive and negative charges are generated in the second photoelectric conversion layer 512. The positive charges move toward the pixel electrode 50 along the electric field between the pixel electrode 50 and the counter electrode 52. However, as shown in FIG. 6, the ionization potential of rubrene is higher than the ionization potential of SnNc, and a potential barrier for the positive charges is formed between the HOMO level of SnNc and the HOMO level of rubrene. Therefore, when the bias between the pixel electrode 50 and the counter electrode 52 is small, the positive charges cannot overcome the potential barrier and do not reach the pixel electrode 50. This means that the unit pixel cell 14 does not have sensitivity in the infrared wavelength range.

When the bias between the pixel electrode 50 and the counter electrode 52 is increased to impart, to the positive charges, energy sufficient to overcome the potential barrier, the positive charges can overcome the potential barrier and reach the pixel electrode 50. Specifically, for example, by supplying the second voltage VB having a larger absolute value than the first voltage VA to the counter electrode 52 from the voltage application circuit 60, the positive charges generated in the second photoelectric conversion layer 512 can be collected by the pixel electrode 50. In other words, by changing the bias voltage supplied to the unit pixel cell 14, the unit pixel cell 14 can have sensitivity in the infrared wavelength range. In this state, the unit pixel cell 14 has sensitivity in the visible wavelength range and also in the infrared wavelength range.

According to studies by the inventors, when the absolute value of the ionization potential of the first material is larger by at least 0.2 eV than the absolute value of the ionization potential of the second material, the effect of changing the spectral sensitivity characteristics by changing the bias voltage can be obtained. In the structure in which the second photoelectric conversion layer 512 is located between the first photoelectric conversion layer 511 and the counter electrode 52 as exemplified in FIG. 6, a switching voltage that causes the potential of the counter electrode 52 to be higher than the potential of the pixel electrode 50 is used.

As described above, when the absolute value of the ionization potential of the first material is larger by at least 0.2 eV than the absolute value of the ionization potential of the second material, the spectral sensitivity characteristics of the unit pixel cell 14 can be electrically changed even when the impedance of the first photoelectric conversion layer 511 is equal to or lower than the impedance of the second photoelectric conversion layer 512. In this case, the impedance of the first photoelectric conversion layer 511 may be larger than the impedance of the second photoelectric conversion layer 512.

Figure 8:
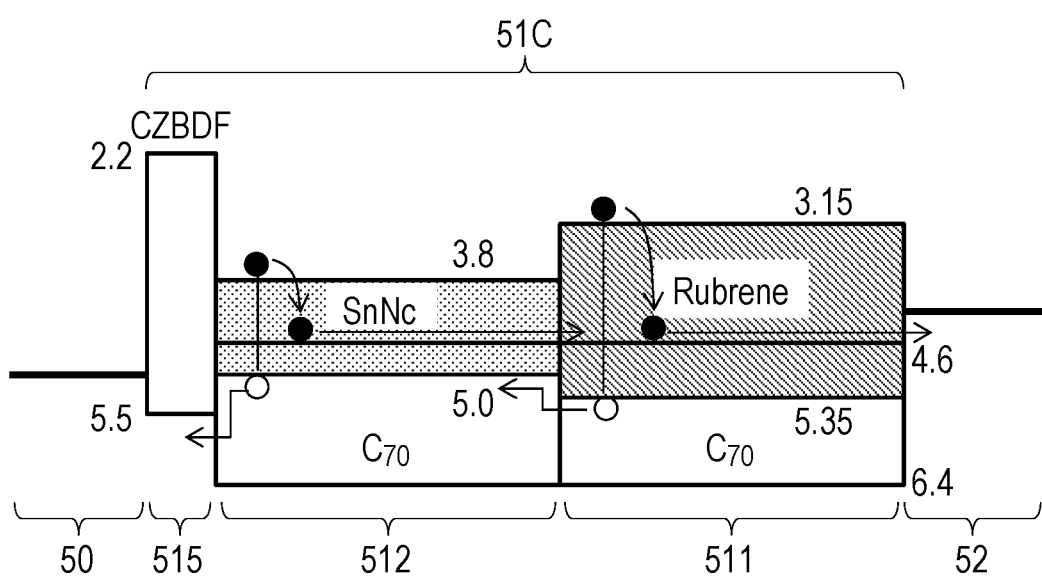
FIG. 8 is an energy diagram of a photoelectric conversion structure in which the positions of a first photoelectric conversion layer and a second photoelectric conversion layer in the photoelectric conversion structure shown in FIG. 6 are exchanged with each other.

FIG. 8 is an energy diagram of a photoelectric conversion structure 51C in which the positions of the first photoelectric conversion layer 511 and the second photoelectric conversion layer 512 in the photoelectric conversion structure 51B shown in FIG. 6 are exchanged with each other.

In the structure shown in FIG. 8, no potential barrier for positive charges moving toward the pixel electrode 50 is present between the first photoelectric conversion layer 511 and the second photoelectric conversion layer 512. Therefore, by using a bias voltage that causes the potential of the counter electrode 52 to be higher than the potential of the pixel electrode 50, positive charges generated in the first photoelectric conversion layer 511 and also positive charges generated in the second photoelectric conversion layer 512 can reach the pixel electrode 50, as schematically shown by open circles and arrows in FIG. 8. Therefore, the effect of changing the spectral sensitivity characteristics by using the difference in ionization potential between the first photoelectric conversion layer 511 and the second photoelectric conversion layer 512 is not expected. However, when the impedance of the first photoelectric conversion layer 511 is larger than the impedance of the second photoelectric conversion layer 512, the function of changing the spectral sensitivity characteristics by changing the bias voltage can be obtained even for the above stacking order. The impedance of the first photoelectric conversion layer and the impedance of the second photoelectric conversion layer may be impedances at a frequency of 1 Hz with the first and second photoelectric conversion layers not irradiated with light.

According to at least one of the embodiments of the present disclosure, by using at least two bias voltages with different absolute values, the spectral sensitivity characteristics of the unit pixel cell 14 can be electrically changed as described above. Positive and negative charges are generated by photoelectric conversion. When the negative charges are used as signal charges, a hole blocking layer is used instead of the electron blocking layer 515, and a bias voltage that causes the potential of the counter electrode 52 to be lower than the potential of the pixel electrode 50 is supplied. In both the examples in FIGS. 6 and 8, no potential barrier for electrons is formed between the first photoelectric conversion layer 511 and the second photoelectric conversion layer 512. When the impedance of the first photoelectric conversion layer 511 is larger than the impedance of the second photoelectric conversion layer 512, the spectral sensitivity characteristics can be changed by changing the bias voltage. The impedance of the first photoelectric conversion layer and the impedance of the second photoelectric conversion layer may be impedances at a frequency of 1 Hz with the first and second photoelectric conversion layers not irradiated with light.

(Operation Examples of Imaging Device)

Next, operation examples of the imaging device 101 will be described.

Figure 9:
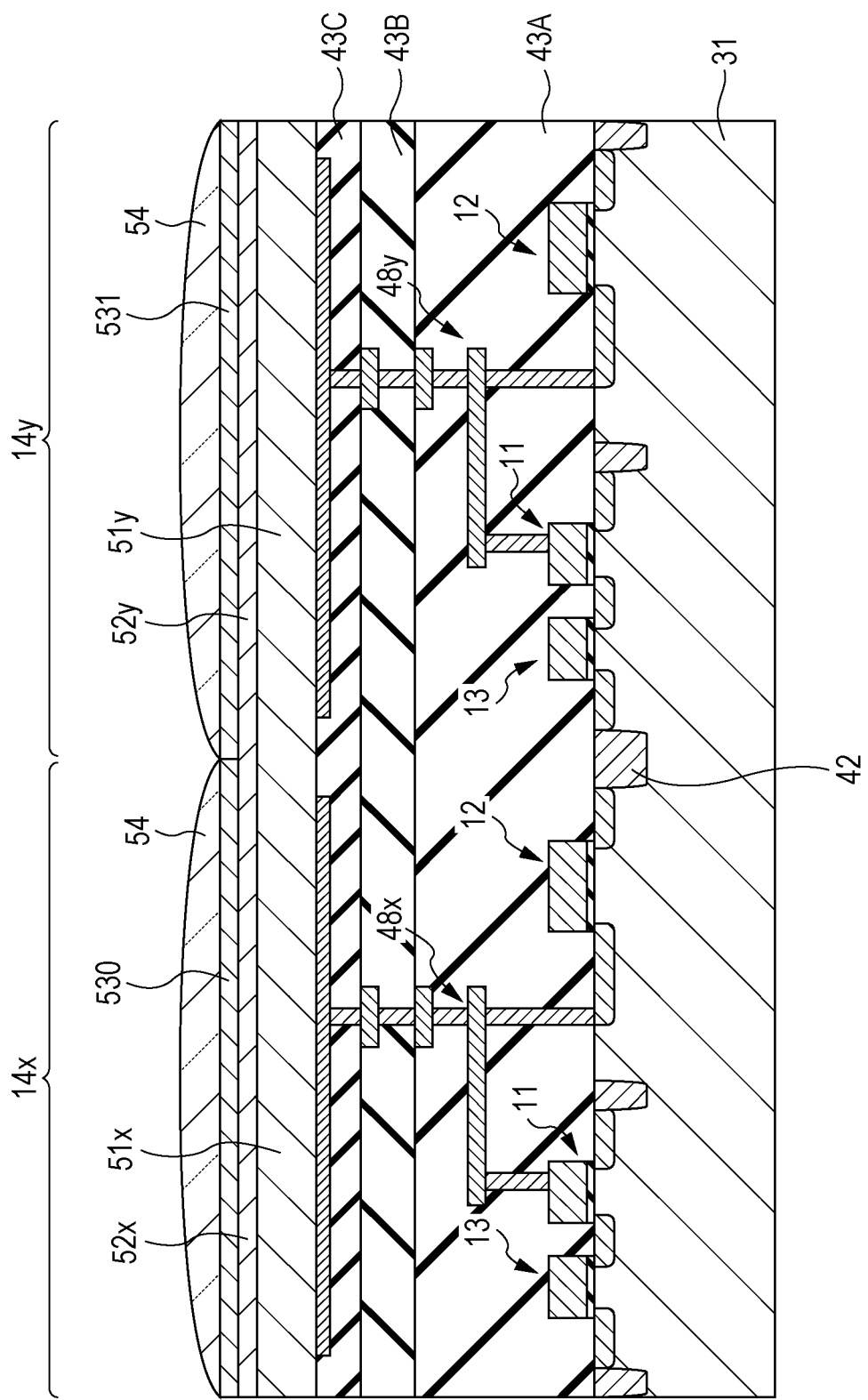
FIG. 9 is a schematic cross-sectional view showing a cross section of two adjacent unit pixel cells in a photosensitive region.

FIG. 9 is a schematic cross-sectional view of two adjacent unit pixel cells in the photosensitive region. As described above with reference to FIG. 2, each of the unit pixel cells 14 in the photosensitive region may have an optical filter 53 facing the counter electrode 52. FIG. 9 schematically shows a cross-section of a unit pixel cell 14x having an optical filter 530 and a cross-section of a unit pixel cell 14y having an optical filter 531. The optical filters 530 and 531 in the structure exemplified above are color filters that can selectively transmit light in the visible and infrared wavelength ranges, and their wavelength ranges in which light in the visible range is selectively absorbed differ from each other.

The optical filter 530 may be one of an R filter having high transmittance of red light, a G filter having high transmittance of green light, and a B filter having high transmittance of blue light. The optical filter 531 may be another one of the R, G, and B filters.

In the exemplified structure, a material having a high absorption coefficient in the visible range (e.g., DTDCTB) and a material having a high absorption coefficient in the infrared range (e.g., SnNc) are used as the first material and the second material, respectively, contained in a photoelectric conversion structure 51x of the unit pixel cell 14x and a photoelectric conversion structure 51y of the unit pixel cell 14y. Each of the photoelectric conversion structures 51x and 51y includes a layered structure including a first photoelectric conversion layer 511 and a second photoelectric conversion layer 512, although the layered structure is omitted in FIG. 9 to avoid excessive complexity of the illustration. In the example described herein, the impedance of the first photoelectric conversion layer 511 is larger than the impedance of the second photoelectric conversion layer 512. The impedance of the first photoelectric conversion layer and the impedance of the second photoelectric conversion layer may be impedances at a frequency of 1 Hz with the first and second photoelectric conversion layers not irradiated with light. Alternatively, the absolute value of the ionization potential of the first material is larger by at least 0.2 eV than the absolute value of the ionization potential of the second material.

In the structure exemplified in FIG. 9, the photoelectric conversion structure 51x of the unit pixel cell 14x and the photoelectric conversion structure 51y of the unit pixel cell 14y are formed as a single continuous structure. When a plurality of unit pixel cells 14 share a common photoelectric conversion structure as in this example, the photoelectric conversion structures 51 of the plurality of unit pixel cells 14 can be formed at once, so an increase in complexity of the manufacturing process can be avoided.

In this example, a counter electrode 52x of the unit pixel cell 14x and a counter electrode 52y of the unit pixel cell 14y are each formed as a part of a single continuous electrode. In this structure, the counter electrodes 52 of the plurality of unit pixel cells 14 can be formed at once, so an increase in complexity of the manufacturing process can be avoided. When the single continuous electrode is used to form the counter electrodes 52 of the plurality of unit pixel cells 14, the same switching voltage can be applied to the counter electrodes 52 of the plurality of unit pixel cells 14 while an increase in complexity of wiring lines is avoided. The counter electrode 52 of the unit pixel cells 14 may be spaced apart and electrically isolated from each other. In this case, mutually different switching voltages may be supplied independently to one unit pixel cell 14 and another unit pixel cell 14.

Figure 10:
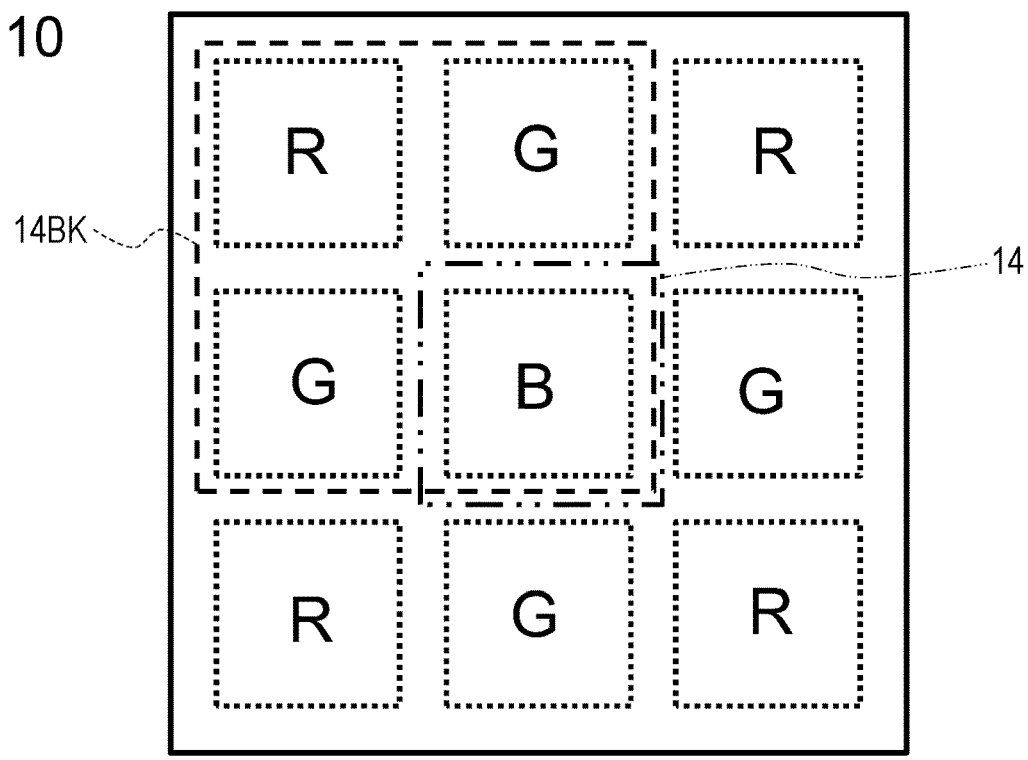
FIG. 10 is a schematic plan view showing an example of the arrangement of optical filters.

FIG. 10 shows an example of the appearance of the photosensitive region including the unit pixel cells 14x and 14y shown in FIG. 9, the photosensitive region being viewed in a direction normal to the semiconductor substrate 31. In this example, a Bayer pattern color filter array is used. Specifically, one of the R, G, and B filters used as the optical filters 53 is disposed in each unit pixel cell 14 so as to face its counter electrode 52. FIG. 10 shows nine unit pixel cells 14. Here, attention is given to a pixel block 14BK including four unit pixel cells 14 arranged in a 2×2 matrix. As shown in FIG. 10, in the structure in which the color filters are disposed on the unit pixel cells 14, the following operation modes I and II, for example, are applicable.

In the operation mode I, the voltage application circuit 60 generates voltages $V_L$ and $V_H$ satisfying the relation $|V_L|<|V_H|$, and the voltage outputted is switched between the voltage $V_L$ used as the first voltage and the voltage $V_H$ used as the second voltage for every frame. During application of the first voltage $V_L$, the photoelectric conversion structure 51 of each unit pixel cell 14 has sensitivity in the visible wavelength range. During application of the second voltage $V_H$, the photoelectric conversion structure 51 of each unit pixel cell 14 has sensitivity in the visible and infrared wavelength ranges. In this case, R, G, and B image signals (frames when the switching voltage is the first voltage $V_L$) and image signals using a combination of red light and infrared light, a combination of green light and infrared light, and a combination of blue light and infrared light (frames when the switching voltage is the second voltage $V_H$) are outputted alternately for every frame from a unit pixel cell 14 having the R filter, unit pixel cells 14 each having the G filter, and a unit pixel cell 14 having the B filter.

The imaging device 101 may include a signal processing circuit connected to the horizontal signal reading circuit 20 (see FIG. 1). For example, the signal processing circuit performs arithmetic processing on the image signals from the unit pixel cells 14 to form an image. In the first operation mode I, the signal processing circuit can form an RGB color image using the output in a frame in which the first voltage $V_L$ is used as the switching voltage. The signal processing circuit determines differences in pixel value between the same pixels in images of two successive frames. Signal components of the red light, the green light, and the blue light can thereby be removed, and an image using the infrared light can be obtained. In this operation mode, a color image (a still image or a motion video) and an image using the infrared light (a still image or a motion video) can be obtained substantially simultaneously.

In the operation mode II, one of the first voltage $V_L$ and the second voltage $V_H$ is selectively supplied to each of the unit pixel cells 14 according to, for example, the usage scene of the imaging device 101. For example, when the imaging device 101 is used as a security camera or a vehicle-mounted camera, the voltage application circuit 60 generates the first voltage $V_L$ as the switching voltage during the daytime. Therefore, color images are acquired during the daytime. During the nighttime, the voltage application circuit 60 generates the second voltage $V_H$ as the switching voltage to acquire images. In this case, the imaging device 101 acquires images using a combination of red light and infrared light, a combination of green light and infrared light, and a combination of blue light and infrared light. During the nighttime, not much information about the visible range is contained in the images acquired. Therefore, images using substantially only infrared light can be acquired. The use of infrared lighting is more effective in acquiring images using infrared light. With the arrangement of the optical filters 53 exemplified in FIG. 10 the image acquired can be switched, for example, between an RGB image and an image using infrared light by changing the bias applied between the pixel electrode 50 and the counter electrode 52.

Figure 11:
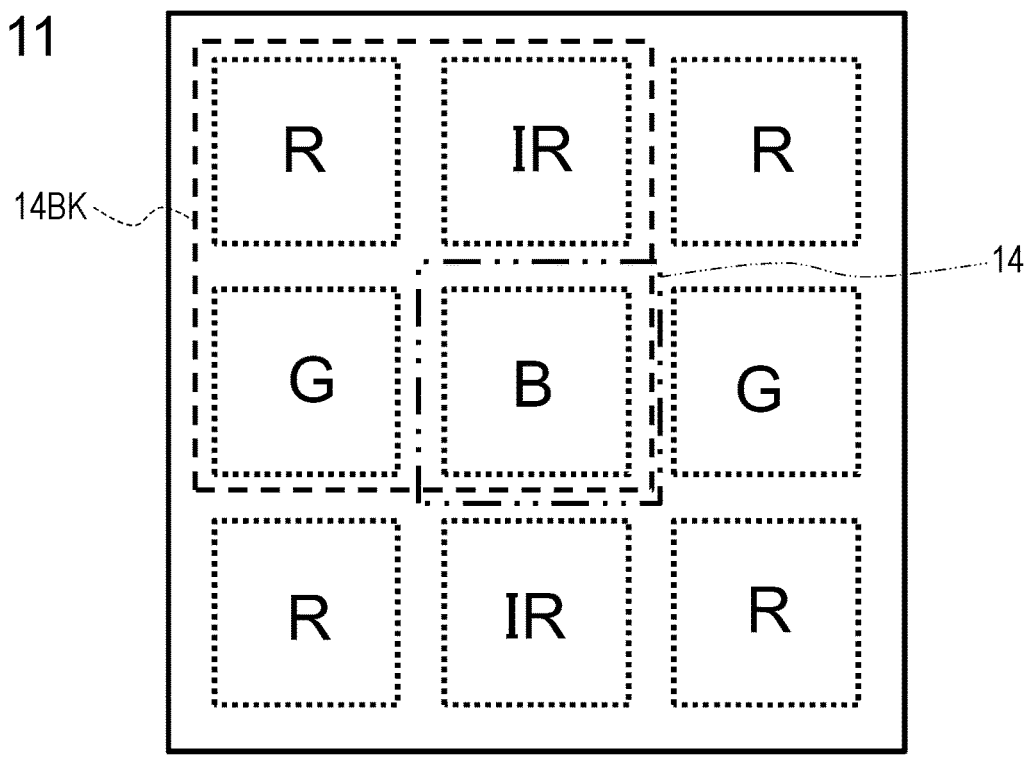
FIG. 11 is a schematic plan view showing another example of the arrangement of the optical filters.

FIG. 11 shows another example of the appearance of the photosensitive region including the unit pixel cells 14x and 14y shown in FIG. 9, the photosensitive region being viewed in a direction normal to the semiconductor substrate 31. In this example, in contrast to the structure shown in FIG. 10, one of the G filters in the pixel block 14BK is replaced with an infrared pass filter (IR filter). In this structure the following operation mode III can be used.

In the operation mode III also, one of the first voltage $V_L$ and the second voltage $V_H$ is selectively supplied to each of the unit pixel cells 14 according to, for example, the usage scene of the imaging device 101. In the state in which the voltage application circuit 60 supplies the first voltage $V_L$ to the unit pixel cells 14, the photoelectric conversion structure 51 of each unit pixel cell 14 has sensitivity in the visible wavelength range. Therefore, an RGB color image can be obtained using the output from unit pixel cells 14 with the R, G, or B filter disposed therein. A pixel value of the unit pixel cell 14 with the IR filter disposed therein may be complemented, for example, using pixel values of unit pixel cells therearound. In the state in which the switching voltage supplied from the voltage application circuit 60 to the unit pixel cells 14 is the second voltage $V_H$, each unit pixel cell 14 with the IR filter disposed therein outputs an image signal using infrared light. Therefore, by selectively acquiring image signals from the unit pixel cells 14 each having the IR filter disposed therein, an image using infrared light can be formed. In this case, the unit pixel cells 14 each having the R filter disposed therein, the unit pixel cells 14 each having the G filter disposed therein, and the unit pixel cells 14 each having the B filter disposed therein output image signals for red light and infrared light, image signals for green light and infrared light, and image signals for blue light and infrared light, respectively. The image signals from the unit pixel cells 14 having the color filters disposed therein may not be used and may be discarded. Specifically, in the operation mode III, when the voltage application circuit 60 supplies the first voltage $V_L$ to the unit pixel cells 14, a color image using visible light is acquired. When the second voltage $V_H$ is supplied to the unit pixel cells 14, an image using infrared light can be acquired. For example, when the imaging device 101 is used as a security camera or a vehicle-mounted camera, the camera obtained can acquire color images during the daytime and images using infrared light during the night time.

With the arrangement of the optical filters 53 exemplified in FIG. 11, unit pixel cells 14 that output RGB image signals and also unit pixel cells 14 that output image signals using infrared light can be present in the photosensitive region. Therefore, as in the case of the operation mode I or II, the image obtained can be switched between an RGB image and an image using infrared light.

In the operation modes I, II, and III described above, the switching voltage is switched between the first voltage $V_L$ and the second voltage $V_H$ according to the wavelength range used to acquire an image. However, while the same voltage is supplied from the voltage application circuit 60 to the plurality of unit pixel cells 14, the unit pixel cells 14 can have different spectral sensitivity characteristics.

Figure 12:
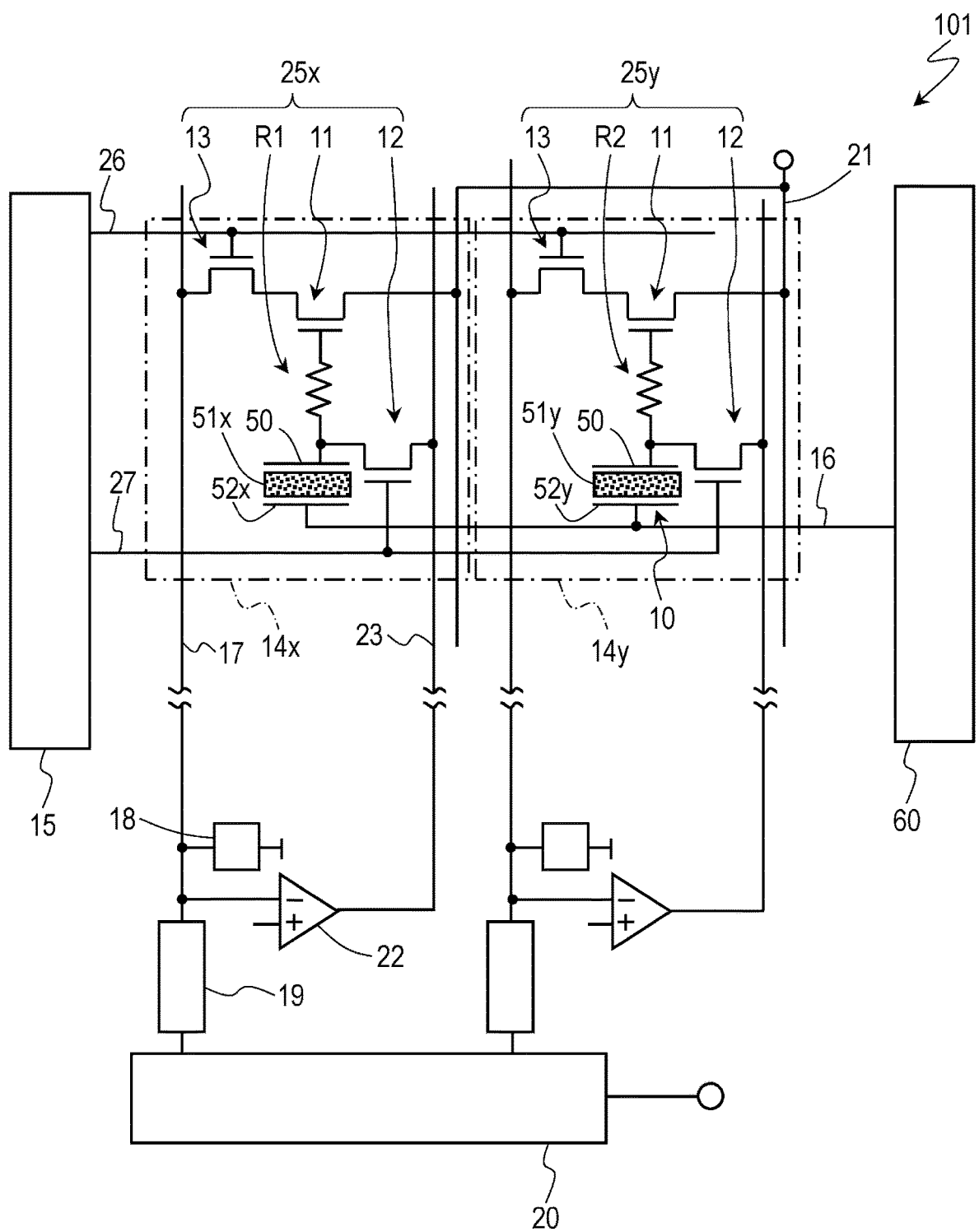
FIG. 12 is a schematic diagram showing another example of the circuit structure of the imaging device according to the embodiment of the present disclosure.

FIG. 12 shows another example of the circuit structure of the imaging device according to the embodiment of the present disclosure. In the structure exemplified in FIG. 12, a charge detection circuit 25x of a unit pixel cell 14x and a charge detection circuit 25y of a unit pixel cell 14y include resistors R1 and R2, respectively. In the example illustrated, each of the resistors R1 and R2 is connected between a gate electrode of a corresponding amplification transistor 11 and a pixel electrode 50 of a corresponding photoelectric converter 10. The resistors R1 and R2 have different resistance values. For example, the resistance value of the resistor R1 is larger than the resistance value of the resistor R2.

In the circuit structure exemplified in FIG. 12, when the second voltage $V_H$ is applied to counter electrodes 52x and 52y, the voltage drop across the resistor R1 differs from the voltage drop across the resistor R2. Therefore, even when the same voltage is applied from the voltage application circuit 60 to the unit pixel cells 14x and 14y, the effective bias voltage applied between the pixel electrode 50 and the counter electrode 52 in the unit pixel cell 14x can differ from the effective bias voltage applied between the pixel electrode 50 and the counter electrode 52 in the unit pixel cell 14y.

In this example, when the same second voltage $V_H$ is supplied to the counter electrodes 52x and 52y, the electric field applied to a photoelectric conversion structure 51y of the unit pixel cell 14y is larger than the electric field applied to a photoelectric conversion structure 51x of the unit pixel cell 14x. Therefore, an electric field large enough to impart sensitivity in the visible and infrared wavelength ranges can be applied to the unit pixel cell 14y. Specifically, although the same voltage (the second voltage $V_H$ in this case) is applied to the counter electrodes 52x and 52y, an image signal for visible light (e.g., red light) can be acquired by the unit pixel cell 14x, and an image signal for visible light (e.g., red light) and infrared light can be acquired by the unit pixel cell 14y. When an IR filter is used instead of an optical filter 531 in the unit pixel cell 14y, the unit pixel cell 14y can acquire an image signal for infrared light.

The resistors R1 and R2 are not limited to individual components independent of other circuit elements, and, for example, wiring resistance in each charge storage node 24 may be used as the resistor R1 or R2. In the structure exemplified in FIG. 9, for example, the material of the connection member 48x of the unit pixel cell 14x or the thickness, length, etc. of the plugs therein may differ from the material of the connection member 48y of the unit pixel cell 14y or the thickness, length, etc. of the plugs therein. In this case, since the resistance value of the connection member 48x can differ from the resistance value of the connection member 48y, the connection member 48x and 48y can be used as the resistors R1 and R2, respectively.

Figure 13:
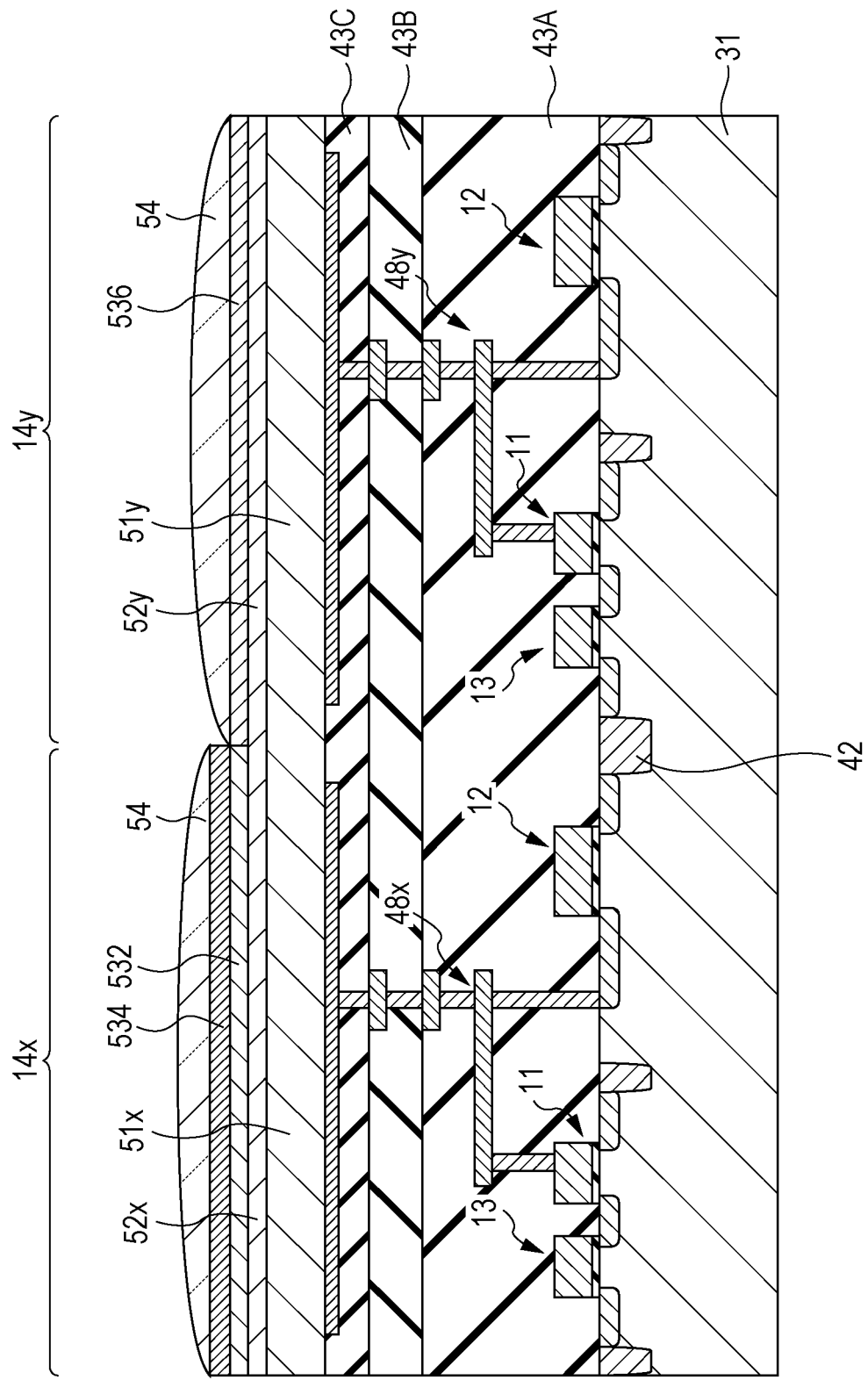
FIG. 13 is a schematic cross-sectional view showing another example of the arrangement of the optical filters.

FIG. 13 shows another example of the arrangement of the optical filters. In the structure exemplified in FIG. 13, the unit pixel cell 14x includes a color filter 532 (e.g., an R, G, or B filter) and an infrared cut filter 534 facing the color filter 532, and the unit pixel cell 14y adjacent to the unit pixel cell 14x includes an IR filter 536. In this structure, an operation mode IV described below can be used.

In the operation mode IV, as in the example described with reference to FIG. 12, the bias voltage used when an image is captured is fixed. The voltage application circuit 60 applies the second voltage $V_H$ to the counter electrodes 52x and 52y. In the state in which the second voltage $V_H$ is applied, the photoelectric conversion structures 51x and 51y in the photoelectric converters 10 each have sensitivity in the visible range and in the infrared range. In this case, the unit pixel cell 14x including the color filter 532 and the infrared cut filter 534 outputs an image signal for, for example, red, green, or blue light. Therefore, an RGB color image can be formed using the image signal from the unit pixel cell 14x. A pixel value of the unit pixel cell 14y including the IR filter 536 may be complemented, for example, using pixel values of unit pixel cells therearound. The unit pixel cell 14y including the IR filter 536 outputs an image signal for infrared light. Therefore, an infrared light image can be formed using the image signal from the unit pixel cell 14y. Specifically, with the structure exemplified in FIG. 13, a camera capable of acquiring an RGB color image and an image using infrared light simultaneously can be obtained.

Table 1 below shows the relation between an operation mode of the imaging device 101 and image signals obtained.

TABLE 1

| Operation mode | Combination of optical filters in pixel block | Switching voltage | Image signals obtained |
|---|---|---|---|
| I | R filter<br>G filter<br>G filter<br>B filter | $V_L$ and $V_H$ are applied alternately | During application of $V_L$:<br>Red light, green light, and blue light<br>During application of $V_H$:<br>Red light and infrared light, green light and infrared light, and blue light and infrared light |
| II | R filter<br>G filter | $V_L$ | Red light, green light, and blue light |
|  | G filter<br>B filter | $V_H$ | Red light and infrared light, green light and infrared light, and blue light and infrared light |
| III | R filter<br>IR filter | $V_L$ | Red light, green light, and blue light |
|  | G filter<br>B filter | $V_H$ | Infrared light<br>(RGB image signals are discarded) |
| IV | R filter and infrared cut filter<br>IR filter<br>G filter and infrared cut filter<br>B filter and infrared cut filter | $V_H$ | Red light, green light, blue light, and infrared light |

As described above, by using a plurality of optical filters that differ in wavelength range in which light can selectively pass through, a plurality of unit pixel cells 14 that have the same photoelectric conversion structure but differ in spectral sensitivity characteristics can be present in the photosensitive region. Moreover, by changing the bias voltage applied between the pixel electrode 50 and the counter electrode 52 in each unit pixel cell 14, sensitivity to light in a wavelength range corresponding to the absorption spectrum of the materials forming the second photoelectric conversion layer 512 (particularly the second material) can be controlled. Therefore, the image acquired can be switched, for example, between an image using visible light and an image using infrared light according to the switching voltage supplied from the voltage application circuit 60 to the unit pixel cells 14. According to the embodiment of the present disclosure, an imaging device that can acquire an image using visible light and an image using infrared light sequentially or simultaneously can be provided. The number of switching voltages is not limited to 2 and may be 3 or more.

The operation modes I, II, III, and IV described above are merely examples, and various operation modes are applicable to the imaging device 101. In the above examples, the sensitivity in the infrared wavelength range is controlled by changing the switching voltage. However, in some combinations of the first and second materials used to form the photoelectric conversion structure 51, the sensitivity in the visible wavelength range can be controlled by changing the switching voltage. For example, an imaging device capable of acquiring an image using infrared light during application of the first voltage $V_L$ and acquiring a color image during application of the second voltage $V_H$ can be obtained. In the operation modes I, II, III, and IV described above, the image acquired is switched between an image using visible light and an image using infrared light. However, this operation is not a limitation, and the image acquired may be switched between images using light in other wavelength ranges.

A specific value of the switching voltage supplied from the voltage application circuit 60 to the unit pixel cells 14 may be set appropriately according to the configuration of the photoelectric conversion structure 51. For example, the voltage application circuit 60 may generate, as the switching voltage, a voltage selected within a voltage range in which the sensitivity in the visible range in the photoelectric conversion structure 51 changes in a specific manner but almost no change occurs in the sensitivity in the infrared range. In this case, sensitivity to a specific wavelength in the visible range can be increased or reduced. Therefore, an imaging device that can acquire images with different wavelength distributions in a switchable manner can be obtained.

EXAMPLES

Samples having the same layered structure as that of the photoelectric converter 10 described above were produced. For each of the samples produced, its external quantum efficiency was measured at different biases to evaluate the change in spectral sensitivity characteristics with respect to the change in bias. The samples were produced as follows.

Example 1-1

First, a glass substrate was prepared. Next, materials shown in Table 2 were sequentially deposited on the glass substrate by vacuum evaporation to thereby form, on the glass substrate, a layered structure including a lower electrode, an electron blocking layer, a lower photoelectric conversion layer, an upper photoelectric conversion layer, and an upper electrode. The thicknesses of the layers formed are also shown in Table 2. The lower photoelectric conversion layer was formed by co-evaporation of SnNc and $C_{70}$. Similarly, the upper photoelectric conversion layer was formed by co-evaporation of DTDCTB and $C_{70}$. In the formation of the lower and upper photoelectric conversion layers, the conditions for evaporation were controlled such that the volume ratio of SnNc to $C_{70}$ and the volume ratio of DTDCTB to $C_{70}$ were 1:1. A sample in Example 1-1 was thereby obtained.

TABLE 2

| Layer | Material | Thickness (nm) |
|---|---|---|
| Upper electrode | Al | 80 |
| Upper photoelectric conversion layer | DTDCTB:$C_{70}$ (1:1) | 60 |
| Lower photoelectric conversion layer | SnNc:$C_{70}$ (1:1) | 60 |

TABLE 2-continued

| Layer | Material | Thickness (nm) |
|---|---|---|
| Electron blocking layer | CZBDF | 10 |
| Lower electrode | ITO | 150 |

Next, a spectral sensitivity measurement device CEP-25RR manufactured by Bunkoukeiki Co. Ltd. was connected to the lower and upper electrodes, and the external quantum efficiency of the sample in Example 1-1 was measured while the voltage applied between the lower and upper electrodes was changed. Specifically, with the amount of light supplied to the measurement target held constant, the external quantum efficiency was measured while the potential of the lower electrode was changed to −3V, −5V, −8V, −10V, and −11V with the upper electrode grounded. The application of these bias voltages is adapted to the above-described structure in which positive charges are collected by the pixel electrode 50 in the photoelectric converter 10. Specifically, in this example, the positive charges generated by photoelectric conversion move toward the lower electrode. The lower and upper electrodes in the sample in Example 1-1 correspond to the pixel electrode 50 and the counter electrode 52, respectively, in the photoelectric converter 10 described above. However, since light enters through the glass substrate in the measurement, ITO is used as the material of the lower electrode, and Al is used as the material of the upper electrode.

Figure 14:
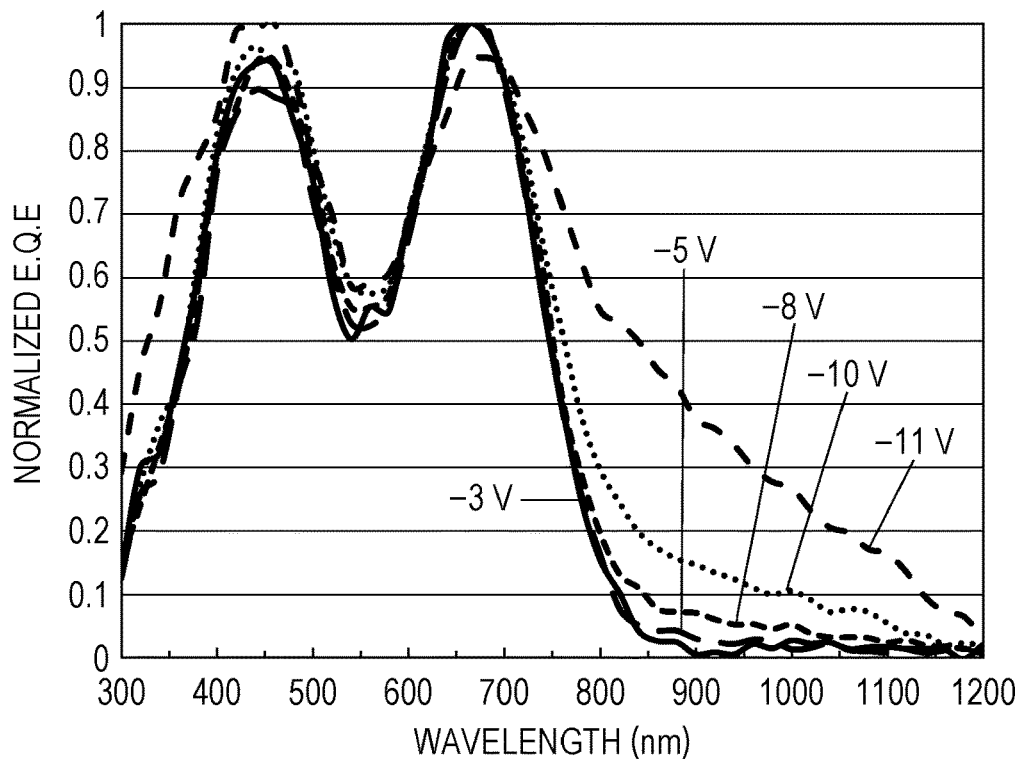
FIG. 14 is a graph showing the voltage dependence of the external quantum efficiency of a sample in Example 1-1.

FIG. 14 shows the voltage dependence of the external quantum efficiency of the sample in Example 1-1. The graph shown in FIG. 14 is normalized such that a peak value of the external quantum efficiency is 1. Graphs in figures subsequent to FIG. 14 that show the voltage dependence of the external quantum efficiency are also normalized such that a peak value of the external quantum efficiency is 1.

As can be seen from FIG. 14, when the absolute value of the bias voltage applied to the lower electrode is small, i.e., the intensity of the electric field applied between the two electrodes is small, the external quantum efficiency around the absorption peak of SnNc contained in the lower photoelectric conversion layer is relatively small. Specifically, the sensitivity in the infrared range is low. However, in the visible range in which DTDCTB contained in the upper photoelectric conversion layer exhibits an absorption peak, the external quantum efficiency obtained is relatively high. As can be seen from FIG. 14, as the absolute value of the bias voltage applied between the upper and lower electrodes is increased, the external quantum efficiency in the infrared range increases. Specifically, the sensitivity in the wavelength range corresponding to the absorption spectrum of SnNc increases with the magnitude of the bias voltage.

For example, the external quantum efficiency at around a wavelength of 870 nm corresponding to the absorption peak of SnNc when the potential of the lower electrode is −11 V is larger by a factor of about 33.7 than the external quantum efficiency when the potential of the lower electrode is −3 V. Although not shown in FIG. 14, the external quantum efficiency at around a wavelength of 870 nm corresponding to the absorption peak of SnNc when the potential of the lower electrode is −15V is larger by a factor of about 77.3 than the external quantum efficiency when the potential of the lower electrode is −3 V.

Next, with the sample not irradiated with light, the impedance of the upper photoelectric conversion layer and the impedance of the lower photoelectric conversion layer were compared at a prescribed frequency. To measure the impedance, a sample having only the upper photoelectric conversion layer between the lower and upper electrodes and a sample having only the lower photoelectric conversion layer between the lower and upper electrodes were used. The structure of the sample used to measure the impedance of the upper photoelectric conversion layer is the same as the sample in Example 1-1 except that the lower photoelectric conversion layer and the electron blocking layer are not formed and the thickness of the upper photoelectric conversion layer is changed to 200 nm. The structure of the sample used to measure the impedance of the lower photoelectric conversion layer is the same as the sample in Example 1-1 except that the upper photoelectric conversion layer and the electron blocking layer are not formed and the thickness of the lower photoelectric conversion layer is changed to 200 nm. To measure and analyze the impedance, ModuLab XM ECS manufactured by TOYO Corporation and Zplot software were used. A frequency sweep mode was used as the operation mode. The amplitude was set to 10 mV, and the frequency was changed from 1 Hz to 1 MHz. In the measurement, a start delay of 5 second was used. As for the upper and lower photoelectric conversion layers, their impedance values at a bias voltage between the upper and lower electrodes of −8 V and a frequency of 1 Hz with the upper and lower photoelectric conversion layers not irradiated with light were compared.

The impedance of the upper photoelectric conversion layer containing DTDCTB at a bias voltage of −8 V and a frequency of 1 Hz was $7.5 \times 10^6 \Omega$, and the impedance of the lower photoelectric conversion layer containing SnNc was $4.2 \times 10^3 \Omega$. The impedance of the upper photoelectric conversion layer is larger by a factor of about 1,800 than the impedance of the lower photoelectric conversion layer.

Figure 15:
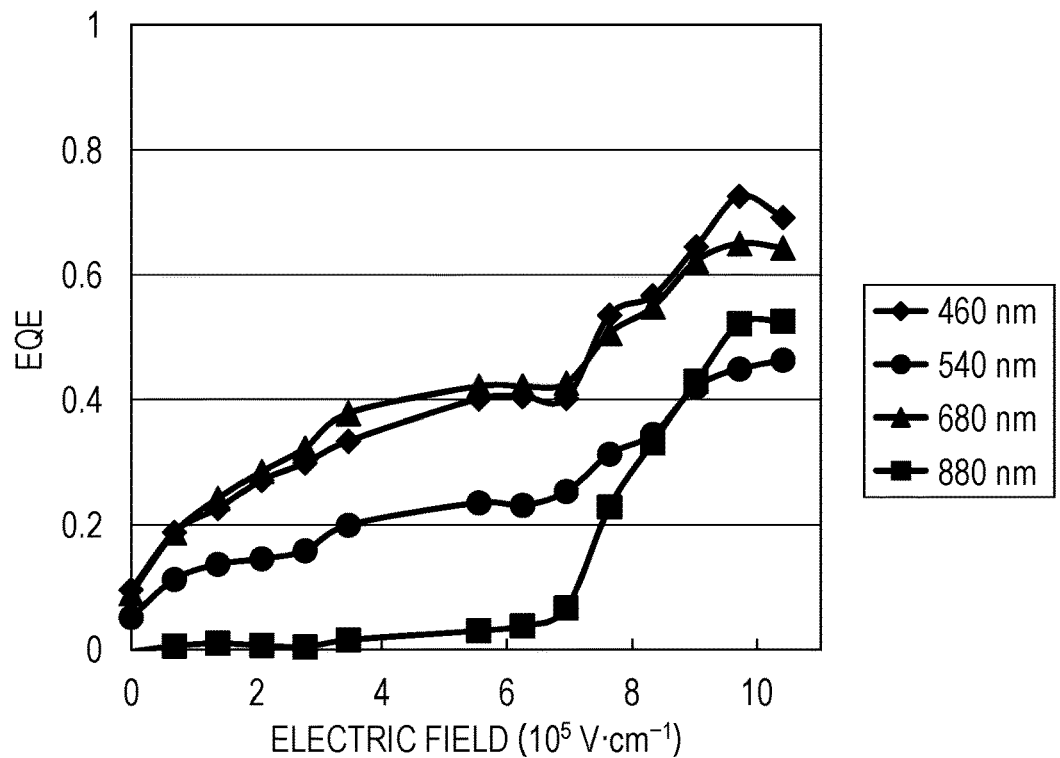
FIG. 15 is a graph showing the relation between an applied electric field and the external quantum efficiency of the sample in Example 1-1 at wavelengths of 460 nm, 540 nm, 680 nm, and 880 nm.

FIG. 15 shows the relation between the applied electric field and the external quantum efficiency of the sample in Example 1-1 at wavelengths of 460 nm, 540 nm, 680 nm, and 880 nm. The horizontal axis of the graph shown in FIG. 15 is a value obtained by dividing the bias voltage applied between the upper and lower electrodes by the total thickness of the upper photoelectric conversion layer, the lower photoelectric conversion layer, and the electron blocking layer. Specifically, the horizontal axis of the graph in FIG. 15 corresponds to the magnitude of the electric field applied between the upper and lower electrodes.

As can be seen from the example shown in FIG. 15, the external quantum efficiency for light with a wavelength of 880 nm is almost zero at an electric field intensity of about less than $4 \times 10^5$ V/cm and starts increasing at an electric field intensity of about $4 \times 10^5$ V/cm or more. When a sufficiently large bias is applied to the photoelectric conversion structure including the first and second photoelectric conversion layers (see, for example, FIG. 3), a sufficiently large bias can be applied to a layer having a smaller impedance among the two photoelectric conversion layers. As can be seen from FIG. 15, by applying a sufficiently large bias to the layer having a smaller impedance among the two photoelectric conversion layers, the external quantum efficiency of this layer exhibits a relatively high external quantum efficiency.

As can be seen from FIG. 15, the external quantum efficiencies at wavelengths of 460 nm, 540 nm, 680 nm, and 880 nm tend to saturate when the magnitude of the electric field between the upper and lower electrodes is about $9 \times 10^5$ V/cm or higher. Specific values of the first voltage VA and the second voltage VB can be determined, for example, as follows. The second voltage VB used may be a voltage at which the intensity of the electric field applied to the photoelectric conversion structure is 70% or more of the intensity of the electric field at which the external quantum efficiency for light in a first wavelength range (e.g., the visible range) and the external quantum efficiency for light in a second wavelength range (e.g., the infrared range) are saturated. The first voltage VA used may be a voltage at which the intensity of the electric field applied to the photoelectric conversion structure 51 is 30% or less of the intensity of the electric field at which the external quantum efficiency for light in the first wavelength range is saturated. The state in which the external quantum efficiency is about 0.2 or more may be defined as a sensitive state. The first voltage VA and the second voltage VB may be appropriately determined in consideration of the thicknesses etc. of the first photoelectric conversion layer 511 and the second photoelectric conversion layer 512. According to the results of studies by the inventors, the imaging device is practically useful when the external quantum efficiency of the photoelectric conversion structure under application of the second voltage VB at a wavelength corresponding to the absorption peak of the second material included in the second photoelectric conversion layer 512 is about twice or more the external quantum efficiency under application of the first voltage VA, but this depends on the use of the imaging device. Alternatively, the external quantum efficiency of the photoelectric conversion structure under application of the second voltage VB at a wavelength corresponding to the absorption peak of the first material included in the first photoelectric conversion layer 511 is about twice or more the external quantum efficiency under application of the first voltage VA.

Example 1-2

A sample in Example 1-2 was produced in substantially the same manner as for the sample in Example 1-1 except that a mixture layer containing SnNc and DTDCTB was disposed between the lower and upper photoelectric conversion layers. Table 3 below shows the materials and thicknesses of the layers in the sample in Example 1-2. The mixture layer was formed by co-evaporation of three materials, i.e., SnNc, DTDCTB, and $C_{70}$. In the formation of the mixture layer, the evaporation conditions were controlled such that the volume ratio of SnNc, DTDCTB, and $C_{70}$ was 1:1:8. In the formation of the lower photoelectric conversion layer, the evaporation conditions were controlled such that the volume ratio of SnNc to $C_{70}$ was 1:4. In the formation of the upper photoelectric conversion layer, the evaporation conditions were controlled such that the volume ratio of DTDCTB to $C_{70}$ was 1:4.

TABLE 3

| Layer | Material | Thickness (nm) |
| --- | --- | --- |
| Upper electrode | Al | 80 |
| Upper photoelectric conversion layer | DTDCTB:$C_{70}$ (1:4) | 50 |
| Mixture layer | SnNc:DTDCTB:$C_{70}$ (1:1:8) | 20 |
| Lower photoelectric conversion layer | SnNc:$C_{70}$ (1:4) | 50 |
| Electron blocking layer | CZBDF | 10 |
| Lower electrode | ITO | 150 |

Figure 16:
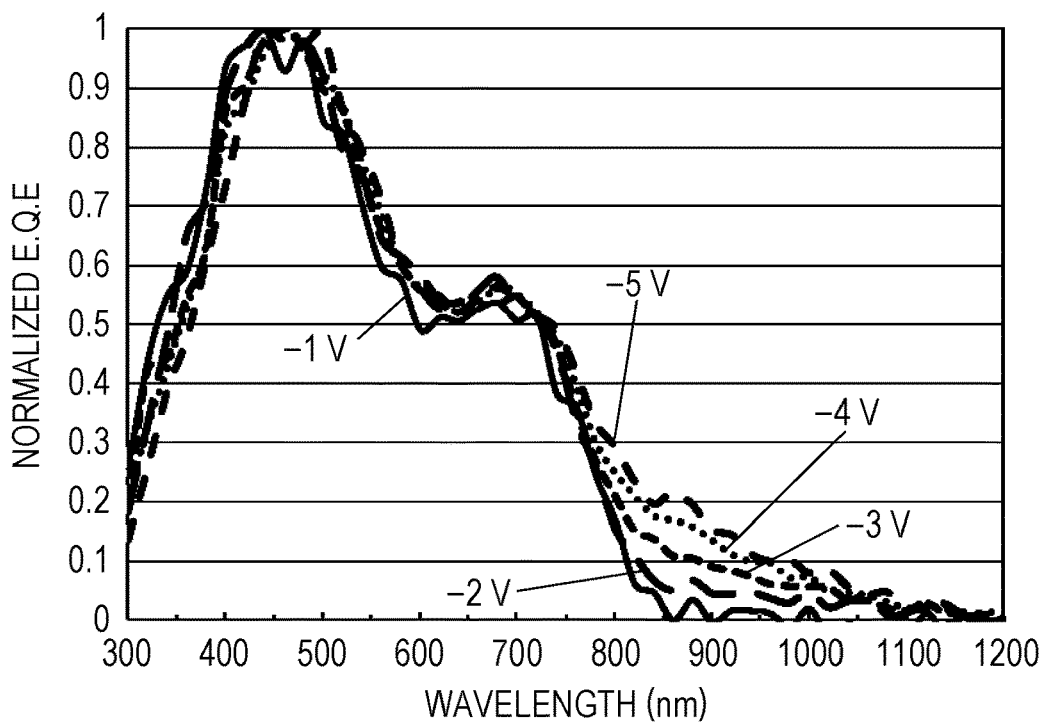
FIG. 16 is a graph showing the voltage dependence of the external quantum efficiency of a sample in Example 1-2.

The voltage dependence of the external quantum efficiency of the sample in Example 1-2 was measured in the same manner as for the sample in Example 1-1. FIG. 16 shows the voltage dependence of the external quantum efficiency of the sample in Example 1-2.

As shown in FIG. 16, in the sample in Example 1-2, as in the sample in Example 1-1, the external quantum efficiency at around a wavelength of 870 nm corresponding to the absorption peak of SnNc contained in the lower photoelectric conversion layer increases as the absolute value of the bias voltage applied to the lower electrode increases. As can be seen from FIG. 16, even in the structure in which the mixture layer containing both the first and second materials is disposed between the first and second photoelectric conversion layers, the effect of changing the sensitivity by changing the bias voltage can be obtained.

Example 1-3

A sample in Example 1-3 was produced in substantially the same manner as for the sample in Example 1-1 except that ClAlPc and $C_{70}$ were used as the materials for forming the lower photoelectric conversion layer. In the formation of the lower photoelectric conversion layer, the evaporation conditions were controlled such that the volume ratio of ClAlPc to $C_{70}$ was 1:9. Table 4 below shows the materials and thicknesses of the layers in the sample in Example 1-3.

TABLE 4

| Layer | Material | Thickness (nm) |
| --- | --- | --- |
| Upper electrode | Al | 80 |
| Upper photoelectric conversion layer | DTDCTB:$C_{70}$ (1:9) | 60 |
| Lower photoelectric conversion layer | ClAlPc:$C_{70}$ (1:1) | 60 |
| Electron blocking layer | CZBDF | 10 |
| Lower electrode | ITO | 150 |

Figure 17:
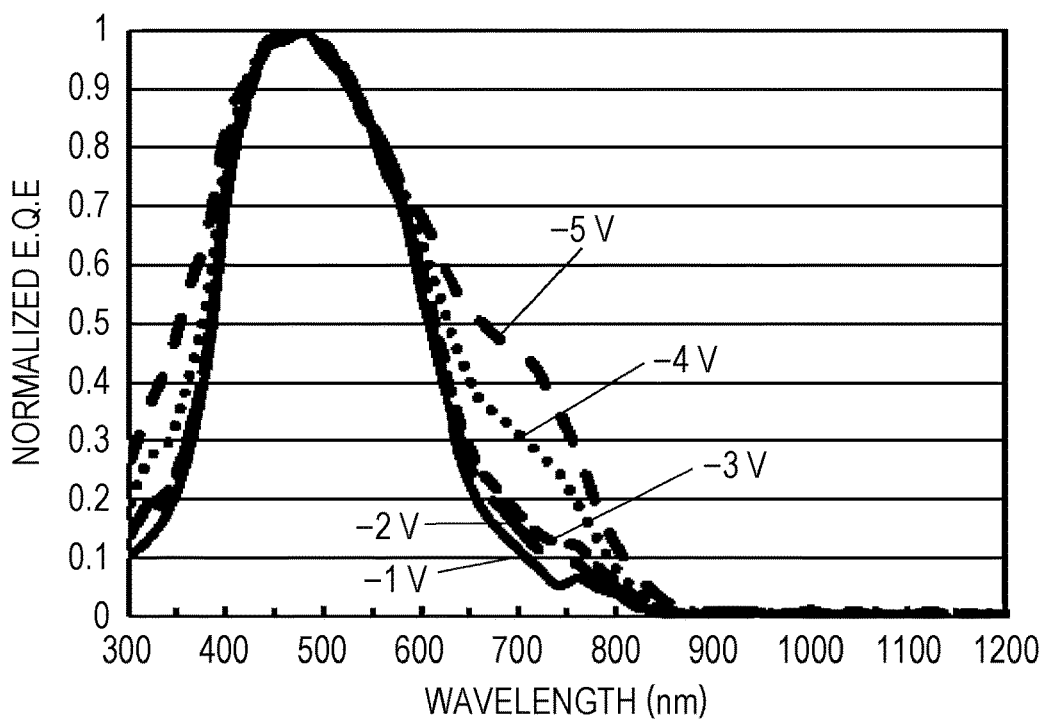
FIG. 17 is a graph showing the voltage dependence of the external quantum efficiency of a sample in Example 1-3.

The voltage dependence of the external quantum efficiency of the sample in Example 1-3 was measured in the same manner as for the sample in Example 1-1. FIG. 17 shows the voltage dependence of the external quantum efficiency of the sample in Example 1-3.

As shown in FIG. 17, in the sample in Example 1-3, as the magnitude of the electric field applied between the two electrodes increases, the external quantum efficiency in the infrared range increases. Specifically, in the sample in Example 1-3, as the absolute value of the bias voltage applied between the upper and lower electrodes increases, the external quantum efficiency at around a wavelength of 750 nm corresponding to the absorption peak of ClAlPc contained in the lower photoelectric conversion layer increases. In other words, the sensitivity in the infrared range is changed by changing the bias voltage. For example, the external quantum efficiency at the wavelength corresponding to the absorption peak of ClAlPc when the potential of the lower electrode is −5 V is larger by a factor of about 6.55 than the external quantum efficiency when the potential of the lower electrode is −1 V.

Next, the same sample as the sample in Example 1-3 except that only the upper photoelectric conversion layer was disposed between the lower and upper electrodes and the same sample as the sample in Example 1-3 except that only the lower photoelectric conversion layer was disposed between the lower and upper electrodes were produced in the same manner as in Example 1-1, and the impedance of the upper photoelectric conversion layer and the impedance of the lower photoelectric conversion layer were measured. The thickness of the upper photoelectric conversion layer and the thickness of the lower photoelectric conversion layer in the measurement samples were 200 nm. Table 5 below shows the results of the impedance measurement. The impedance values below are values when the bias voltage applied between the lower and upper electrodes is −8 V and the frequency is 1 Hz with the samples not irradiated with light.

TABLE 5

| Sample | Layer | Donor-acceptor ratio | Impedance (Ω) |
|---|---|---|---|
| Example 1-3 | Upper photoelectric conversion layer | DTDCTB:$C_{70}$ (1:9) | $1.2 \times 10^7$ |
|  | Lower photoelectric conversion layer | ClAlPc:$C_{70}$ (1:1) | $6.3 \times 10^4$ |

As can be seen from Table 5, in the sample in Example 1-3, the impedance of the upper photoelectric conversion layer is larger by a factor of about 190 than the impedance of the lower photoelectric conversion layer.

The ionization potential of DTDCTB used to form the upper photoelectric conversion layer in each of the samples in Examples 1-1 and 1-3 is about 5.6 eV. The ionization potential of SnNc used to form the lower photoelectric conversion layer in the sample in Example 1-1 is 5.0 eV, and the ionization potential of ClAlPc used to form the lower photoelectric conversion layer in the sample in Example 1-3 is 5.5 eV. Therefore, in the samples in Examples 1-1 and 1-3, no potential barrier for holes is formed between the lower and upper photoelectric conversion layers. This shows that, even when there is no potential barrier for holes, the sensitivity can be changed by changing the bias voltage when a difference in impedance is present between the two photoelectric conversion layers in the layered structure. The impedance of the upper photoelectric conversion layer and the impedance of the lower photoelectric conversion layer may be impedances at a frequency of 1 Hz with the upper and lower photoelectric conversion layers not irradiated with light.

Example 2-1

A sample in Example 2-1 was produced in basically the same manner as in Example 1-1 except that SnNc and $C_{70}$ were used as the materials forming the upper photoelectric conversion layer and rubrene and $C_{70}$ were used as the materials forming the lower photoelectric conversion layer. The volume ratio of SnNc to $C_{70}$ and the volume ratio of rubrene to $C_{70}$ were controlled to 1:4. Table 6 below shows the materials and thicknesses of the layers in the sample in Example 2-1. As shown in Table 6, the thickness of the upper photoelectric conversion layer and the thickness of the lower photoelectric conversion layer were 200 nm.

TABLE 6

| Layer | Material | Thickness (nm) |
|---|---|---|
| Upper electrode | Al | 80 |
| Upper photoelectric conversion layer | SnNc:$C_{70}$ (1:4) | 200 |
| Lower photoelectric conversion layer | Rubrene:$C_{70}$ (1:4) | 200 |
| Electron blocking layer | CZBDF | 10 |
| Lower electrode | ITO | 150 |

Comparative Example 1

A sample in Comparative Example 1 was produced in the same manner as in Example 2-1 except that rubrene and $C_{70}$ were used as the materials forming the upper photoelectric conversion layer and SnNc and $C_{70}$ were used as the materials forming the lower photoelectric conversion layer. Specifically, the sample in Comparative Example 1 has a structure in which the upper and lower photoelectric conversion layers in the sample in Example 2-1 are exchanged with each other. Table 7 below shows the materials and thicknesses of the layers in the sample in Comparative Example 1.

TABLE 7

| Layer | Material | Thickness (nm) |
|---|---|---|
| Upper electrode | Al | 80 |
| Upper photoelectric conversion layer | Rubrene:$C_{70}$ (1:4) | 200 |
| Lower photoelectric conversion layer | SnNc:$C_{70}$ (1:4) | 200 |
| Electron blocking layer | CZBDF | 10 |
| Lower electrode | ITO | 150 |

Figure 18:
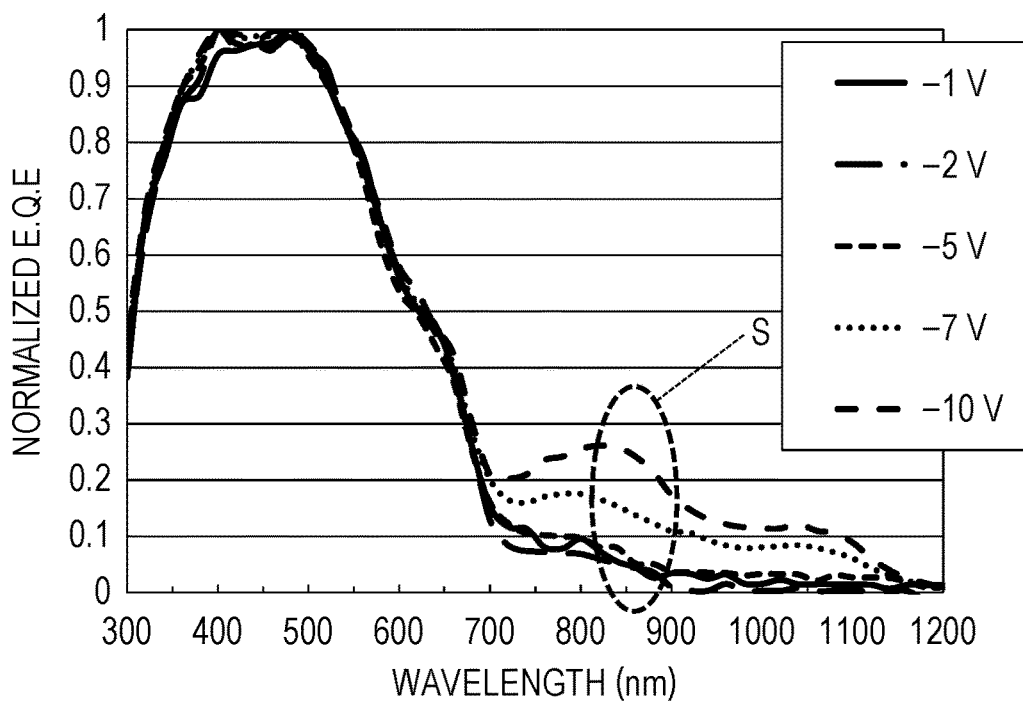
FIG. 18 is a graph showing the voltage dependence of the external quantum efficiency of a sample in Example 2-1.

The voltage dependence of the external quantum efficiency of each of the samples in Example 2-1 and Comparative Example 1 was measured in the same manner as for the sample in Example 1-1. FIG. 18 shows the voltage dependence of the external quantum efficiency of the sample in Example 2-1, and FIG. 19 shows the voltage dependence of the external quantum efficiency in the sample in Comparative Example 1.

As shown by a broken line circle in FIG. 18, in the sample in Example 2-1, as the intensity of the electric field applied between the two electrodes increases, the external quantum efficiency in the infrared range increases. In this example, when the bias voltage applied between the upper and lower electrodes is smaller than about −5 V, sufficient sensitivity is achieved in the infrared range. Specifically, in the sample in Example 2-1, as the absolute value of the bias voltage applied between the upper and lower electrodes increases, the external quantum efficiency around the absorption peak of SnNc contained in the lower photoelectric conversion layer increases. For example, the external quantum efficiency at around a wavelength of 870 nm corresponding to the absorption peak of SnNc when the potential of the lower electrode is −10 V is larger by a factor of 4.27 than the external quantum efficiency when the potential of the lower electrode is −3 V.

Figure 19:
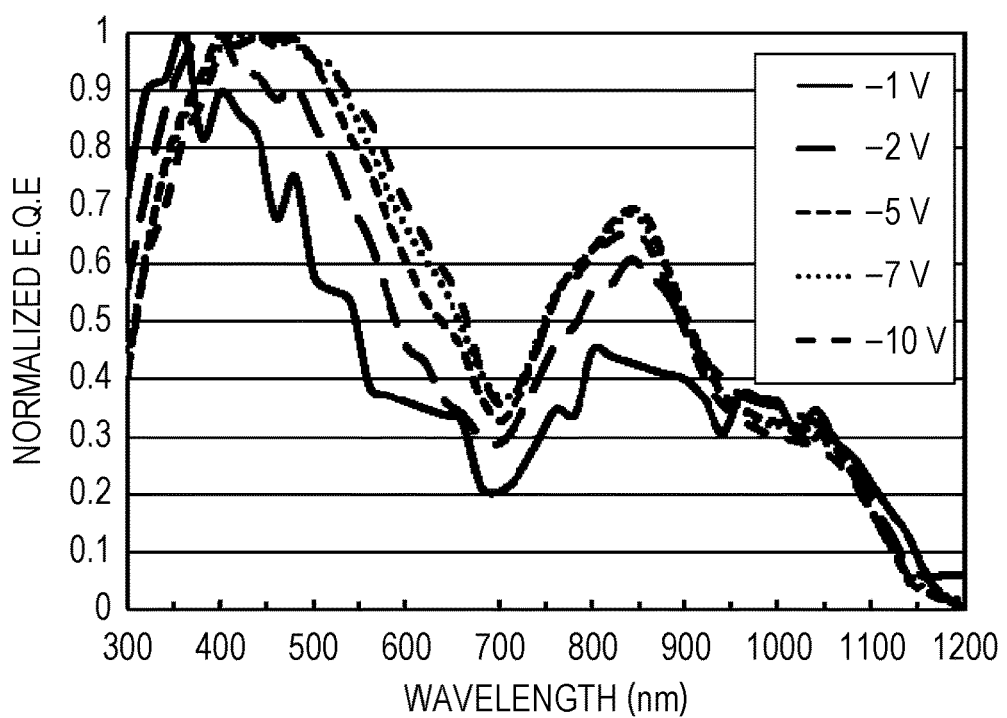
FIG. 19 is a graph showing the voltage dependence of the external quantum efficiency of a sample in Comparative Example 1.

However, as shown in FIG. 19, in the sample in Comparative Example 1, as the intensity of the electric field applied between the two electrodes increases, both the external quantum efficiency in the infrared range and the external quantum efficiency in the visible range increase. Specifically, in the sample in Comparative Example 1, the sensitivity in the infrared range does not change in a specific manner when the bias voltage is changed.

Next, the same sample as the sample in Example 2-1 except that only the upper photoelectric conversion layer was disposed between the lower and upper electrodes and the same sample as the sample in Example 2-1 except that only the lower photoelectric conversion layer was disposed between the lower and upper electrodes were produced in the same manner as in Example 1-1. Moreover, the same sample as the sample in Comparative Example 1 except that only the upper photoelectric conversion layer was disposed between the lower and upper electrodes and the same sample as the sample in Comparative Example 1 except that only the lower photoelectric conversion layer was disposed between the lower and upper electrodes were produced in the same manner as in Example 1-1. For each of the samples, the impedance of the upper photoelectric conversion layer or the impedance of the lower photoelectric conversion layer was measured at a prescribed frequency with the sample not irradiated with light. The thickness of the upper photoelectric conversion layer or the lower photoelectric conversion layer in each measurement sample was 200 nm. Table 8 below shows the results of the impedance measurement.

TABLE 8

| Sample | Layer | Donor-acceptor ratio | Impedance (Ω) |
|---|---|---|---|
| Example 2-1 | Upper photoelectric conversion layer | SnNc:C$_{70}$ (1:4) | $1.0 \times 10^4$ |
| | Lower photoelectric conversion layer | Rubrene:C$_{70}$ (1:4) | $9.0 \times 10^3$ |
| Comparative Example 1 | Upper photoelectric conversion layer | Rubrene:C$_{70}$ (1:4) | $9.0 \times 10^3$ |
| | Lower photoelectric conversion layer | SnNc:C$_{70}$ (1:4) | $1.0 \times 10^4$ |

As can be seen from Table 8, in the sample in Comparative Example 1, the impedance of the upper photoelectric conversion layer is lower than the impedance of the lower photoelectric conversion layer. In the sample in Example 2-1, the impedance of the upper photoelectric conversion layer is larger than the impedance of the lower photoelectric conversion layer. However, the ratio of the impedance of the upper photoelectric conversion layer to the impedance of the lower photoelectric conversion layer is about 1.1, and the difference in impedance between the lower and upper photoelectric conversion layers is not large.

Next, attention is focused on the ionization potentials of rubrene and SnNc. The ionization potential of rubrene is 5.35 eV, and the ionization potential of SnNc is 5.0 eV. Therefore, in the sample in Example 2-1, a potential barrier of 0.35 eV for positive charges moving toward the lower electrode is present between the HOMO level of rubrene and the HOMO level of SnNc (see FIG. 6). In the sample in Comparative Example 1, no potential barrier for positive charges moving toward the lower electrode is present between the HOMO level of rubrene and the HOMO level of SnNc (see FIG. 8). The reason that the sensitivity in the infrared range does not change in a specific manner in the sample in Comparative Example 1 but changes in a specific manner in the sample in Example 2-1 may be that the potential barrier for holes is formed between the two photoelectric conversion layers in the sample in Example 2-1.

Example 2-2

Materials shown in Table 9 below were sequentially deposited on a glass substrate by vacuum evaporation to thereby produce a sample in Example 2-2. The lower photoelectric conversion layer was formed by co-evaporation of ClAlPc and C$_{60}$, and the upper photoelectric conversion layer was formed by co-evaporation of α-6T and C$_{70}$. When the lower photoelectric conversion layer was formed, the evaporation conditions were controlled such that the volume ratio of ClAlPc to C$_{60}$ was 1:4. When the upper photoelectric conversion layer was formed, the evaporation conditions were controlled such that the volume ratio of α-6T to C$_{70}$ was 1:1.

TABLE 9

| Layer | Material | Thickness (nm) |
|---|---|---|
| Upper electrode | Al | 80 |
| Upper photoelectric conversion layer | α-6T:C$_{70}$ (1:1) | 60 |
| Lower photoelectric conversion layer | ClAlPc:C$_{60}$ (1:4) | 60 |
| Electron blocking layer | CZBDF | 10 |
| Lower electrode | ITO | 150 |

Figure 20:
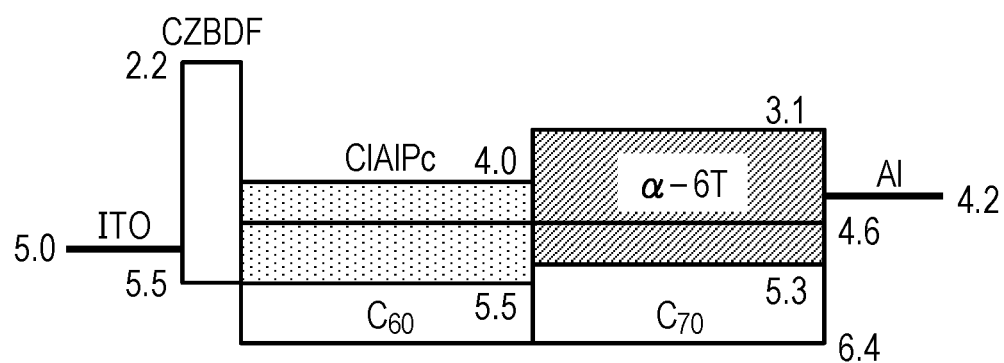
FIG. 20 is an energy diagram of a sample in Example 2-2.

FIG. 20 is an energy diagram of the sample in Example 2-2. As shown in FIG. 20, the ionization potential of ClAlPc is 5.5 eV, and the ionization potential of α-6T is 5.3 eV. In the sample in Example 2-2, a potential barrier of 0.2 eV is formed between the HOMO level of ClAlPc and the HOMO level of α-6T.

Figure 21:
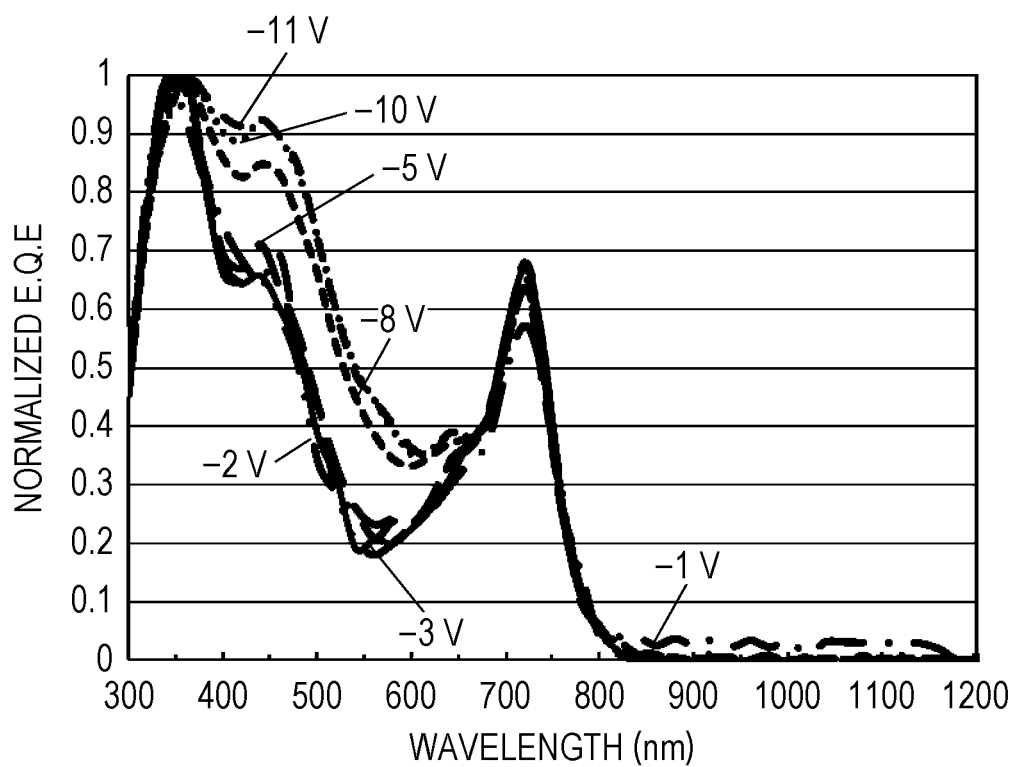
FIG. 21 is a graph showing the voltage dependence of the external quantum efficiency of the sample in Example 2-2.

The voltage dependence of the external quantum efficiency of the sample in Example 2-2 was measured in the same manner as for the sample in Example 1-1. FIG. 21 shows the voltage dependence of the external quantum efficiency of the sample in Example 2-2. As shown in FIG. 21, in the sample in Example 2-2, as the absolute value of the bias voltage applied to the lower electrode increases, the external quantum efficiency at around a wavelength of 440 nm corresponding to the absorption peak of α-6T increases. In other words, the external quantum efficiency in the visible range increases. Specifically, in this example, the effect of changing the sensitivity in the visible range by changing the bias voltage can be obtained.

Comparative Example 2

A sample in Comparative Example 2 was produced in the same manner as in Example 2-2 except that the materials for forming the upper photoelectric conversion layer and the materials for forming the lower photoelectric conversion layer were exchanged with each other. Table 10 below shows the materials and thicknesses of the layers in Comparative Example 2.

TABLE 10

| Layer | Material | Thickness (nm) |
|---|---|---|
| Upper electrode | Al | 80 |
| Upper photoelectric conversion layer | ClAlPc:C$_{60}$ (1:4) | 60 |
| Lower photoelectric conversion layer | α-6T:C$_{70}$ (1:1) | 60 |
| Electron blocking layer | CZBDF | 10 |
| Lower electrode | ITO | 150 |

Figure 22:
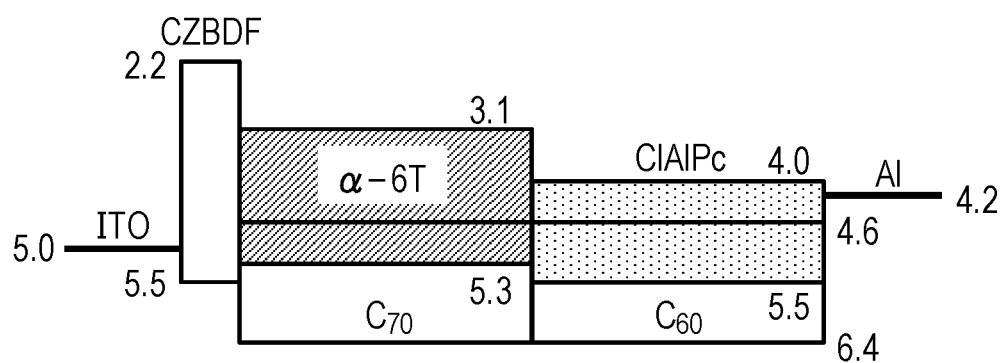
FIG. 22 is an energy diagram of a sample in Comparative Example 2.

FIG. 22 is an energy diagram of the sample in Comparative Example 2. As can be seen from FIG. 22, in this example, no potential barrier for holes is formed between the HOMO level of ClAlPc and the HOMO level of α-6T.

Figure 23:
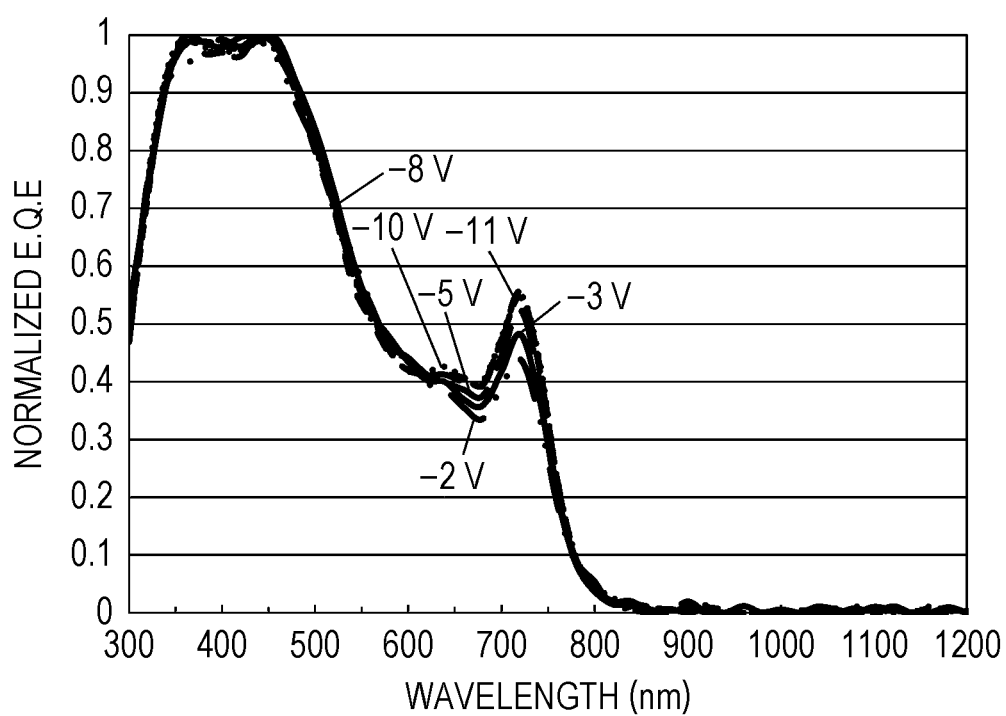
FIG. 23 is a graph showing the voltage dependence of the external quantum efficiency of the sample in Comparative Example 2.

The voltage dependence of the external quantum efficiency of the sample in Comparative Example 2 was measured in the same manner as for the sample in Example 1-1. FIG. 23 shows the voltage dependence of the external quantum efficiency of the sample in Comparative Example 2. As shown in FIG. 23, in the sample in Comparative Example 2, even when the bias voltage applied to the lower electrode is changed, no significant change is found in the graph of the external quantum efficiency, so that the sensitivity is not changed by changing the bias voltage.

As can be seen from FIGS. 18 to 23, by forming a potential barrier for positive charges between the HOMO level of a material included in the upper photoelectric conversion layer and the HOMO level of a material included in the lower photoelectric conversion layer, the sensitivity can be changed by changing the bias voltage. As can be seen from comparison between Example 2-2 and Comparative Example 2, by appropriately selecting the materials in the two photoelectric conversion layers in the layered structure, the external quantum efficiency can be increased in a specific manner also in the visible range.

As can be seen from comparison between Example 2-2 and Comparative Example 2, when, in the layered structure including the two photoelectric conversion layers in the photoelectric conversion structure, one of the two photoelectric conversion layers that is closer to a lower potential electrode (the lower electrode in this example) contains a material having an ionization potential larger by about at least 0.2 eV than the ionization potential of a material of the other photoelectric conversion layer, the effect of increasing the external quantum efficiency in a specific manner can be obtained not only in the infrared range but also in a specific wavelength range. For example, the ionization potential of $Si(OSiR_3)_2Nc$ is 5.4 eV, and the ionization potential of CuPc is 5.2 eV. Therefore, when $Si(OSiR_3)_2Nc$ is used as the first material and CuPc is used as the second material, it is expected that the sensitivity in the visible range can be changed in a specific manner. CuPc may be used instead of rubrene in Example 2-2.

As described above, the embodiment of the present disclosure can provide an imaging device in which the spectral sensitivity characteristics can be electrically changed. In the embodiment of the present disclosure, the external quantum efficiency in a specific wavelength range can be selectively increased using the bias voltage applied to the photoelectric conversion structure of the photoelectric converter. For example, the bias voltage can be supplied from the voltage application circuit disposed outside the photosensitive region to the photoelectric converter of each pixel cell. By using the voltage application circuit that can generate at least two voltage levels in a switchable manner, one selected from the plurality of bias voltages can be selectively applied to the photoelectric converter according to the polarity of the charges collected by the pixel electrode and the specific layered structure in the photoelectric conversion structure. For example, by selecting the bias voltage to be applied to the photoelectric converter from the plurality of bias voltages, the image acquirable wavelength band can be changed. Specifically, with the imaging device in the embodiment of the present disclosure, an image using light in a wavelength range (e.g., visible light) and an image using light in another wavelength range (e.g., infrared light), for example, can be obtained.

The voltage application circuit 60 in the above-described embodiment is configured such that the switching voltage can be applied independently to each of the rows of unit pixel cells 14 arranged two-dimensionally. However, the voltage application circuit 60 may be configured such that the same switching voltage is applied independently to each two rows of unit pixel cells 14 or to all the unit pixel cells 14 in the photosensitive region. Alternatively, the voltage application circuit 60 may be configured such that different voltages can be applied to different unit pixel cells 14 or that different voltages can be applied to different groups other than rows and columns, e.g., different groups of adjacent unit pixel cells 14.

In one example described in the above embodiment, the transistors in each unit pixel cell such as the amplification transistor 11, the reset transistor 12, and the address transistor 13 are N-channel MOSFETs. However, the transistors in the embodiment of the present disclosure are not limited to the N-channel MOSFETs. The transistors in each unit pixel cell may be N-channel MOSFETs and may be P-channel MOSFETs. It is unnecessary that the transistors include only N-channel MOSFETs or only P-channel MOSFETs. In addition to the FETs, bipolar transistors may be used as the transistors in each unit pixel cell.

What is claimed is:

1. An imaging device comprising:
   at least one unit pixel cell including a photoelectric converter that converts incident light into electric charges; and
   a voltage application circuit, wherein
   the photoelectric converter includes:
      a first electrode;
      a second electrode configured to transmit the incident light;
      a first photoelectric conversion layer disposed between the first electrode and the second electrode and containing a first material having an absorption peak at a first wavelength; and
      a second photoelectric conversion layer disposed between the first electrode and the second electrode and containing a second material having an absorption peak at a second wavelength different from the first wavelength,
   an impedance of the first photoelectric conversion layer is larger than an impedance of the second photoelectric conversion layer,
   the voltage application circuit selectively applies a first voltage or a second voltage between the first electrode and the second electrode,
   an absolute value of the second voltage is larger than an absolute value of the first voltage,
   the at least one unit pixel cell comprises a first unit pixel cell and a second unit pixel cell,
   the first photoelectric conversion layer of the first unit pixel cell and the first photoelectric conversion layer of the second unit pixel cell are a single continuous layer, and
   the second photoelectric conversion layer of the first unit pixel cell and the second photoelectric conversion layer of the second unit pixel cell are a single continuous layer.

2. The imaging device according to claim 1, wherein
   the first wavelength falls within a visible wavelength range, and
   the second wavelength falls within an infrared wavelength range.

3. The imaging device according to claim 1,
   wherein the impedance of the first photoelectric conversion layer per unit thickness is larger than the impedance of the second photoelectric conversion layer per unit thickness.

4. The imaging device according to claim 1,
   wherein a ratio of the impedance of the first photoelectric conversion layer to the impedance of the second photoelectric conversion layer is 44 or higher.

5. The imaging device according to claim 1,
   wherein the first material contains electron-donating molecules, and the second material contains electron-donating molecules.

6. The imaging device according to claim 1,
   wherein the first photoelectric conversion layer further contains electron-accepting molecules, and the second photoelectric conversion layer further contains electron-accepting molecules.

7. The imaging device according to claim 1,
   wherein the impedance of the first photoelectric conversion layer and the impedance of the second photoelectric conversion layer are impedances at a frequency of 1 Hz with the first and second photoelectric conversion layers not irradiated with light.

8. The imaging device according to claim 1, wherein
an external quantum efficiency of the photoelectric converter at the second wavelength when the second voltage is applied between the first electrode and the second electrode is larger than an external quantum efficiency of the photoelectric converter at the second wavelength when the first voltage is applied between the first electrode and the second electrode, and
a difference between the external quantum efficiency of the photoelectric converter at the second wavelength when the second voltage is applied and the external quantum efficiency of the photoelectric converter at the second wavelength when the first voltage is applied is larger than a difference between an external quantum efficiency of the photoelectric converter at the first wavelength when the second voltage is applied and an external quantum efficiency of the photoelectric converter at the first wavelength when the first voltage is applied.

9. The imaging device according to claim 1,
wherein the photoelectric converter further includes a mixture layer containing the first material and the second material.

10. The imaging device according to claim 1, further comprising
a color filter facing the second electrode of the first unit pixel cell.

11. The imaging device according to claim 10, further comprising
an infrared pass filter facing the second electrode of the second unit pixel cell.

12. The imaging device according to claim 11, further comprising
an infrared cut filter facing the color filter.

13. The imaging device according to claim 1,
wherein the second electrode of the first unit pixel cell and the second electrode of the second unit pixel cell are a single continuous electrode.

14. The imaging device according to claim 1, wherein
the first wavelength falls within an infrared wavelength range, and
the second wavelength falls within a visible wavelength range.

15. An imaging device comprising:
at least one unit pixel cell including a photoelectric converter that converts incident light into electric charges; and
a voltage application circuit, wherein
the photoelectric converter includes:
  a first electrode;
  a second electrode configured to transmit the incident light;
  a first photoelectric conversion layer disposed between the first electrode and the second electrode and containing a first material having an absorption peak at a first wavelength; and
  a second photoelectric conversion layer disposed between the first electrode and the second electrode and containing a second material having an absorption peak at a second wavelength different from the first wavelength,
an impedance of the first photoelectric conversion layer is larger than an impedance of the second photoelectric conversion layer,
the voltage application circuit selectively applies a first voltage or a second voltage between the first electrode and the second electrode,
an absolute value of the second voltage is larger than an absolute value of the first voltage,
the at least one unit pixel cell comprises a first unit pixel cell and a second unit pixel cell,
the first unit pixel cell includes
  a first charge detection circuit that is electrically connected to the first electrode of the first unit pixel cell and detects the charges and
  a first resistor, and
the second unit pixel cell includes
  a second charge detection circuit that is electrically connected to the first electrode of the second unit pixel cell and detects the charges and
  a second resistor having a resistance value different from a resistance value of the first resistor.

16. An imaging device comprising:
at least one unit pixel cell including a photoelectric converter that converts incident light into electric charges, wherein
the photoelectric converter includes:
  a first electrode;
  a second electrode configured to transmit the incident light;
  a first photoelectric conversion layer disposed between the first electrode and the second electrode and containing a first material having an absorption peak at a first wavelength, and
  a second photoelectric conversion layer disposed between the first electrode and the second electrode and containing a second material having an absorption peak at a second wavelength different from the first wavelength,
an impedance of the first photoelectric conversion layer is larger than an impedance of the second photoelectric conversion layer, and
the photoelectric converter has a characteristic such that,
when a first voltage or a second voltage having a larger absolute value than the first voltage is selectively applied between the first electrode and the second electrode,
an external quantum efficiency of the photoelectric converter at the second wavelength when the second voltage is applied between the first electrode and the second electrode is larger than an external quantum efficiency of the photoelectric converter at the second wavelength when the first voltage is applied between the first electrode and the second electrode, and
a difference between the external quantum efficiency of the photoelectric converter at the second wavelength when the second voltage is applied and the external quantum efficiency of the photoelectric converter at the second wavelength when the first voltage is applied is larger than a difference between an external quantum efficiency of the photoelectric converter at the first wavelength when the second voltage is applied and an external quantum efficiency of the photoelectric converter at the first wavelength when the first voltage is applied.

* * * * *